(12) United States Patent
Lin et al.

(10) Patent No.: US 12,374,399 B2
(45) Date of Patent: Jul. 29, 2025

(54) SEMICONDUCTOR MEMORY DEVICES WITH WRAPPED WORD LINES

(71) Applicant: Taiwan Semiconductor Manufacturing Company, Ltd., Hsinchu (TW)

(72) Inventors: Meng-Han Lin, Hsinchu (TW); Chia-En Huang, Xinfeng (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 607 days.

(21) Appl. No.: 17/408,117

(22) Filed: Aug. 20, 2021

(65) Prior Publication Data

US 2023/0053447 A1 Feb. 23, 2023

(51) Int. Cl.

| | |
|---|---|
| *H10B 41/10* | (2023.01) |
| *G11C 7/18* | (2006.01) |
| *G11C 16/04* | (2006.01) |
| *H10B 41/20* | (2023.01) |
| *H10B 43/10* | (2023.01) |
| *H10B 43/20* | (2023.01) |

(52) U.S. Cl.
CPC ............ *G11C 16/0483* (2013.01); *G11C 7/18* (2013.01); *H10B 41/10* (2023.02); *H10B 41/20* (2023.02); *H10B 43/10* (2023.02); *H10B 43/20* (2023.02)

(58) Field of Classification Search
CPC ...... G11C 16/0483; G11C 7/18; H10B 43/10; H10B 43/20; H10B 43/27; H10B 41/10; H10B 41/20; H10B 41/27
USPC ........................................................ 257/314
See application file for complete search history.

(56) References Cited

U.S. PATENT DOCUMENTS

| | | | |
|---|---|---|---|
| 2017/0025350 A1* | 1/2017 | Ito ..................... | H01L 29/42376 |
| 2020/0343252 A1* | 10/2020 | Lai .......................... | H10B 43/35 |
| 2021/0257366 A1* | 8/2021 | Lee ......................... | H10B 12/50 |
| 2022/0122977 A1* | 4/2022 | Kim ....................... | H01L 29/16 |

* cited by examiner

*Primary Examiner* — Andres Munoz
*Assistant Examiner* — Ashley Nicole Blackwell
(74) *Attorney, Agent, or Firm* — FOLEY & LARDNER LLP

(57) ABSTRACT

A memory device includes a first memory cell. The first memory cell includes: a first conductor structure extending along a lateral direction; a first memory film comprising a first portion wrapping around a first portion of the first conductor structure; and a first semiconductor film wrapping around the first portion of the first memory film. A second conductor structure extends along a vertical direction and is coupled to a first end portion of the first semiconductor film along the lateral direction. A third conductor structure extends along the vertical direction and is coupled to a second end portion of the first semiconductor film along the lateral direction.

20 Claims, 29 Drawing Sheets

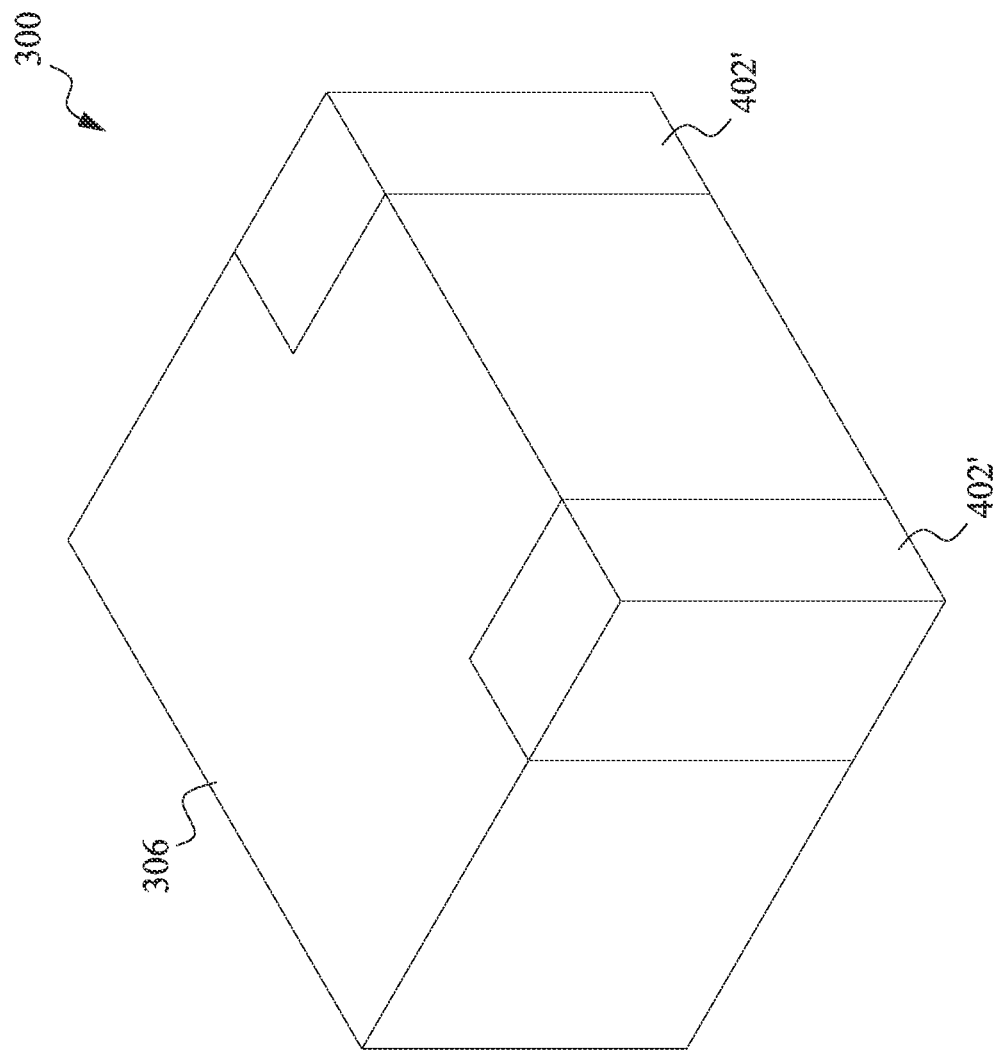
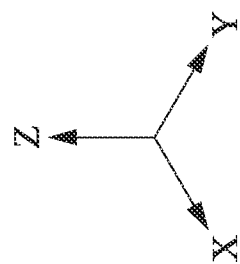
Fig. 5B

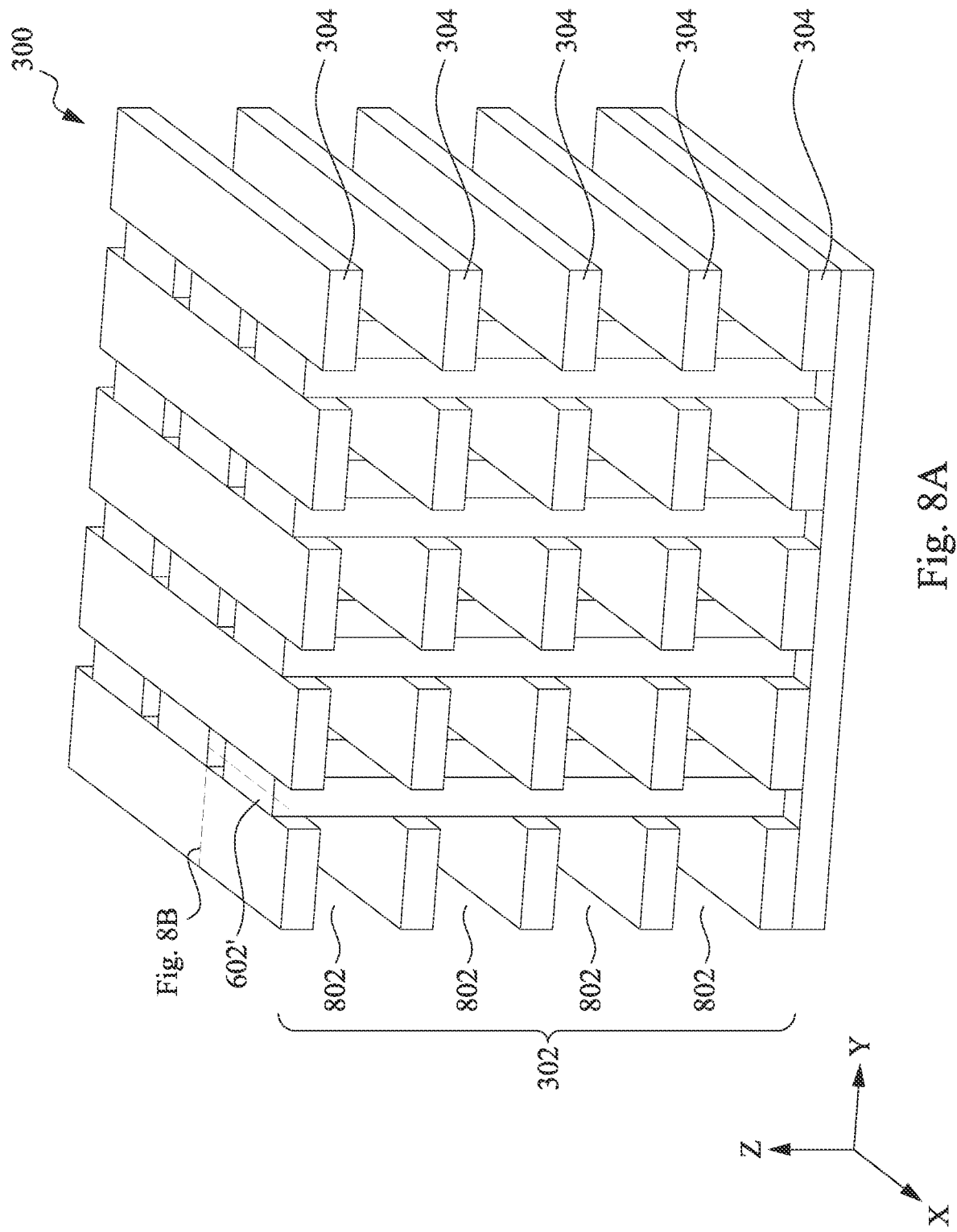

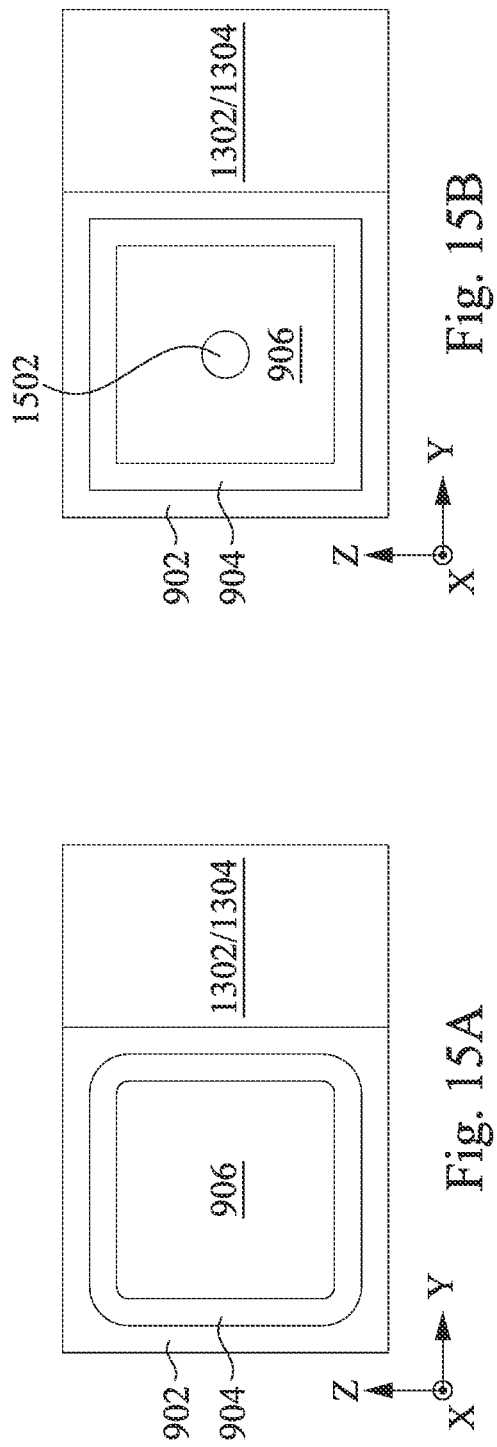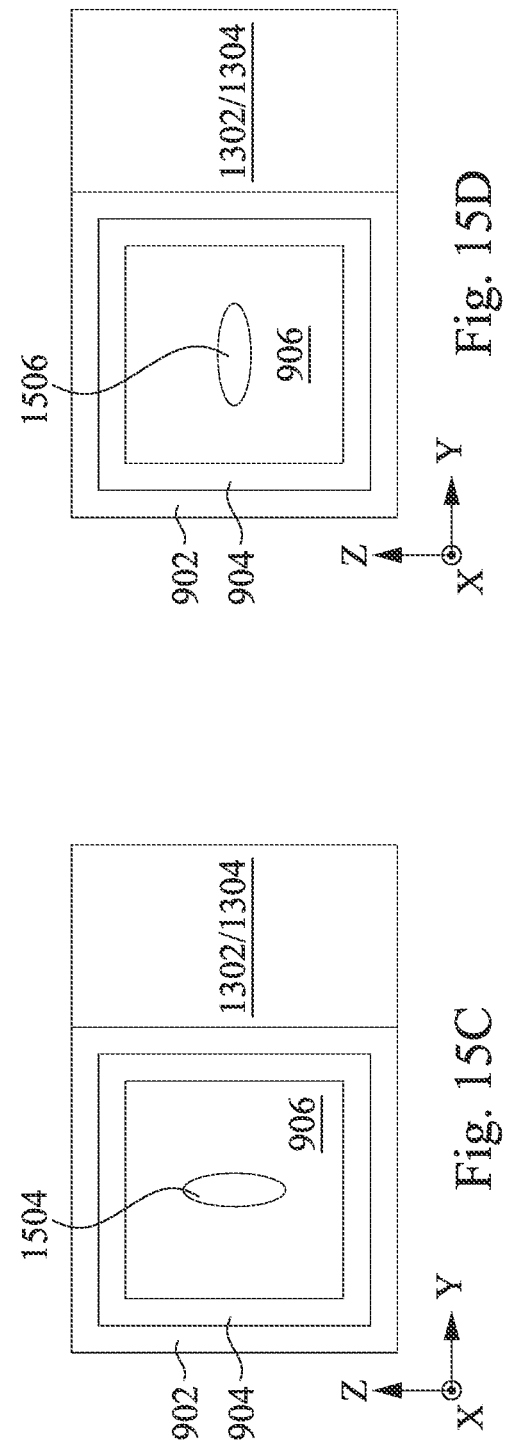

SEMICONDUCTOR MEMORY DEVICES WITH WRAPPED WORD LINES

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 4A, 5A, 6A, 7A, 8A, 9A, 10A, 11A, 12A, and 13A each illustrate a perspective view of an example three-dimensional memory device during various fabrication stages, made by the method of FIG. 2, in accordance with some embodiments.

FIGS. 3B, 4B, 5B, 6B, 7B, 8B, 9B, 10B, 11B, 12B, and 13B illustrate perspective views of a portion of the example three-dimensional memory device shown in FIGS. 3A to 13A, respectively, in accordance with some embodiments.

FIGS. 15A, 15B, 15C, and 15D illustrates various cross-sectional views of a portion of the example three-dimensional memory device shown in FIGS. 3A to 13B, in accordance with some other embodiments.

DETAILED DESCRIPTION

Figure 1:
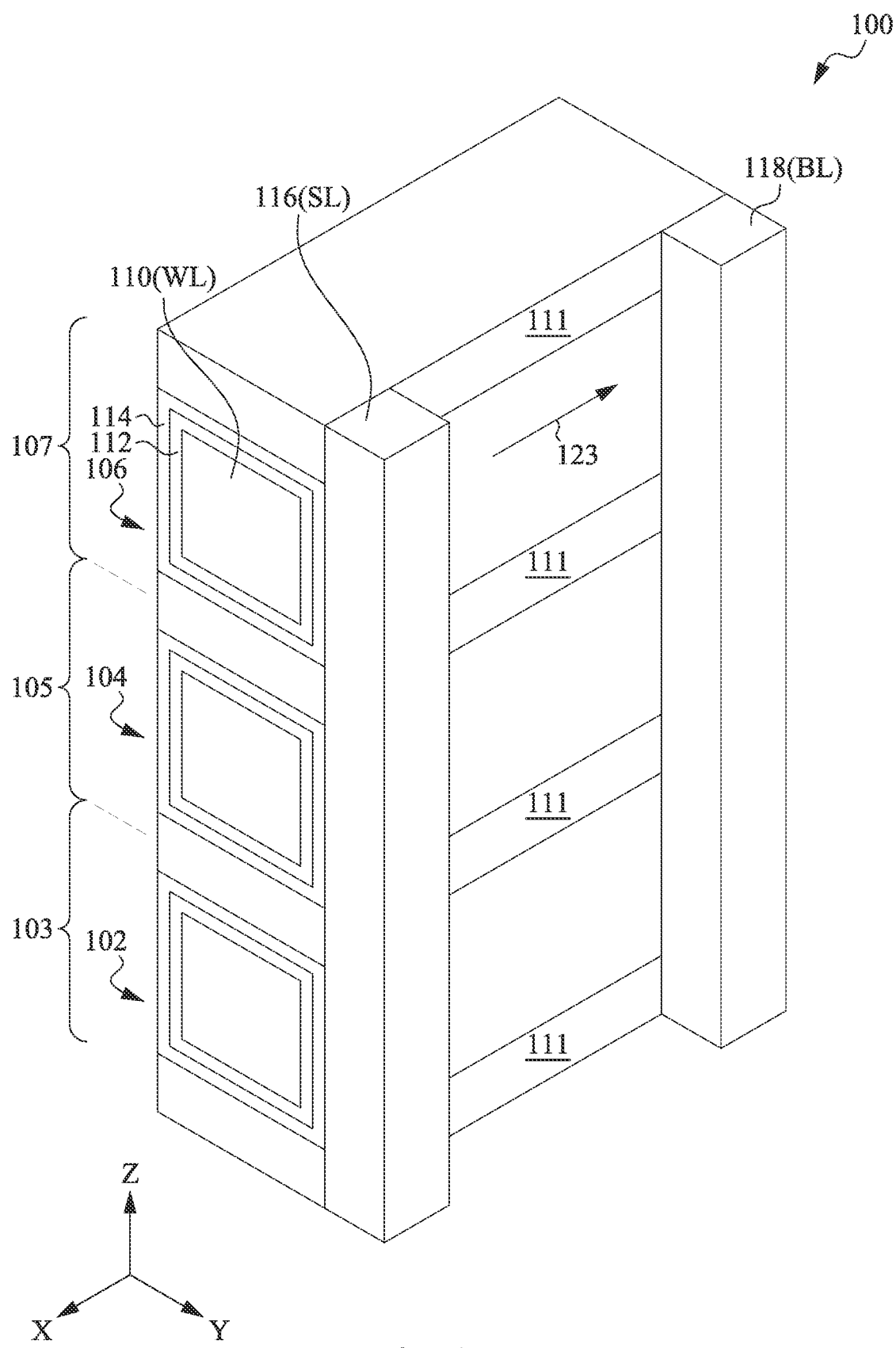
FIG. 1 illustrates a perspective view of an example memory string, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, there are two main classes of components in complementary metal oxide semiconductor (CMOS) integrated circuits (ICs), namely transistors and wires. With "scaling," transistor performance and density typically improve, which can contribute to the increases in IC performance and functionality. However, wires (interconnects) that connect together transistors degrade in performance with such scaling. The situation is typically that wires can contribute a major portion of the performance, functionality and power consumption of ICs. Three-dimensional (3D) stacking of semiconductor devices or chips is one avenue to tackle the wire issues. By arranging transistors in 3 dimensions instead of 2 dimensions, the transistors in ICs can be placed closer to each other. This reduces wire lengths and keeps wiring delay low.

For example, a 3D memory device in which memory cells are stacked in a vertical direction over a substrate have been proposed. In general, such a 3D memory device includes a number of memory cells formed as a number memory strings. The memory cells of each memory string are vertically disposed in different layers/levels, respectively, and thus, are controlled (e.g., gated) by respective different access lines (e.g., word lines (WLs)). However, the memory cells share a same (e.g., semiconductor) channel. Alternative stated, the shared semiconductor channel vertically extends across multiple WLs, with some portions adjacent (or operatively coupled to) respective WLs and some portions not adjacent (or not operatively coupled to) any of the WLs. With such a configuration, a certain amount of leakage current can be induced along the "uncoupled" portions of the channel, which can significantly degrade performance (e.g., a reading window) of the device. Thus, the existing 3D memory devices have not been entirely satisfactory in every aspect.

Embodiments of the present disclosure are discussed in the context of forming a semiconductor device, and particularly in the context of forming a 3D memory device. The 3D memory device, as disclosed herein, includes a number of memory strings, each of which includes a number of memory cells disposed in different memory levels, respectively. Different from the existing 3D memory devices, the memory string includes a number of semiconductor channels disposed in the memory levels, respectively. Stated another way, the memory cells of a memory string have their semiconductor channels disposed in their respective memory levels and not extending to other memory level. Further, each of the semiconductor channels may be formed as closed-ended film that wraps around a respective access line (e.g., a WL) functioning as a gate, in various embodiments. As such, electrical fields induced by each of the gates can be confined within the corresponding channel, which can significantly resolve the leakage issues commonly observed in the existing 3D memory devices.

FIG. 1 illustrates a perspective view of an example memory string 100, as disclosed herein, in accordance with various embodiments of the present disclosure. As shown, the memory string 100 includes memory cells 102, 104, and 106 that are disposed in (memory) levels 103, 105, and 107, respectively. Although three memory cells (or levels) are shown, it should be appreciated that the disclosed memory string can include any number of memory cells while remaining within the scope of the present disclosure. Neighboring memory levels are isolated from each other with an insulating layer 111. Each of the memory cells 102 to 106 (or each of the memory levels 103 to 107) includes a conductor structure extending along a lateral direction (e.g., the X direction), a memory film wrapping around the laterally extending conductor structure, and a semiconductor film further wrapping around the memory film.

Using the memory cell 106 as a representative example, the memory cell 106 includes a laterally extending conductor structure 110, a memory film 112 wrapping around the conductor structure 100, and a semiconductor film 114 further wrapping around the memory film 112. In various embodiments, the conductor structure 110, which is sometimes referred to as a WL in the present disclosure, can function as a gate (terminal) of the memory cell 106, the memory film 112 can function as a gate dielectric of the memory cell 106, and the semiconductor film 114 can function as a channel of the memory cell 106. The memory string 110 further includes a pair of conductor structures 116 and 118 extending along a vertical direction (e.g., the Z direction), thereby crossing all the levels 103 to 107. The conductor structures 116 and 118 can respectively function as a source (terminal) and a drain (terminal) for each of the memory cells 102 to 106. The conductor structures 116 and 118 are sometimes referred to as a bit line (BL) and a source line (SL), respectively, in the present disclosure.

To efficiently operate (e.g., read, write) the memory string 100, the memory cells 102 to 106 may be individually selected, while other unselected memory cells may remain turned off (or deactivated). For example, when the memory cell 106 is selected to be programmed or read, the WL 110 is asserted (e.g., by being applied with a logically high voltage) and the WLs 110 in other levels 103 and 105 remain unasserted (e.g., by being applied with a logically low voltage), such that electricity can be conducted along the channel 114 to flow current 123 from the SL 116 to BL 118. Since the channel 114 is isolated from the channels in other levels, even if there is any electricity conducted in those channels (which may constitute leakage current for the selected memory cell 106), an amount of such leakage current may be significantly low. Further, as the channel 114 is formed (or otherwise confined) around the WL 110, without any potion extending to be coupled to other WL, the majority amount of electrical fields induced by the WL 110 can be confined within the channel 114, which can advantageously increase gate controllability of the selected memory cell.

Figure 2:
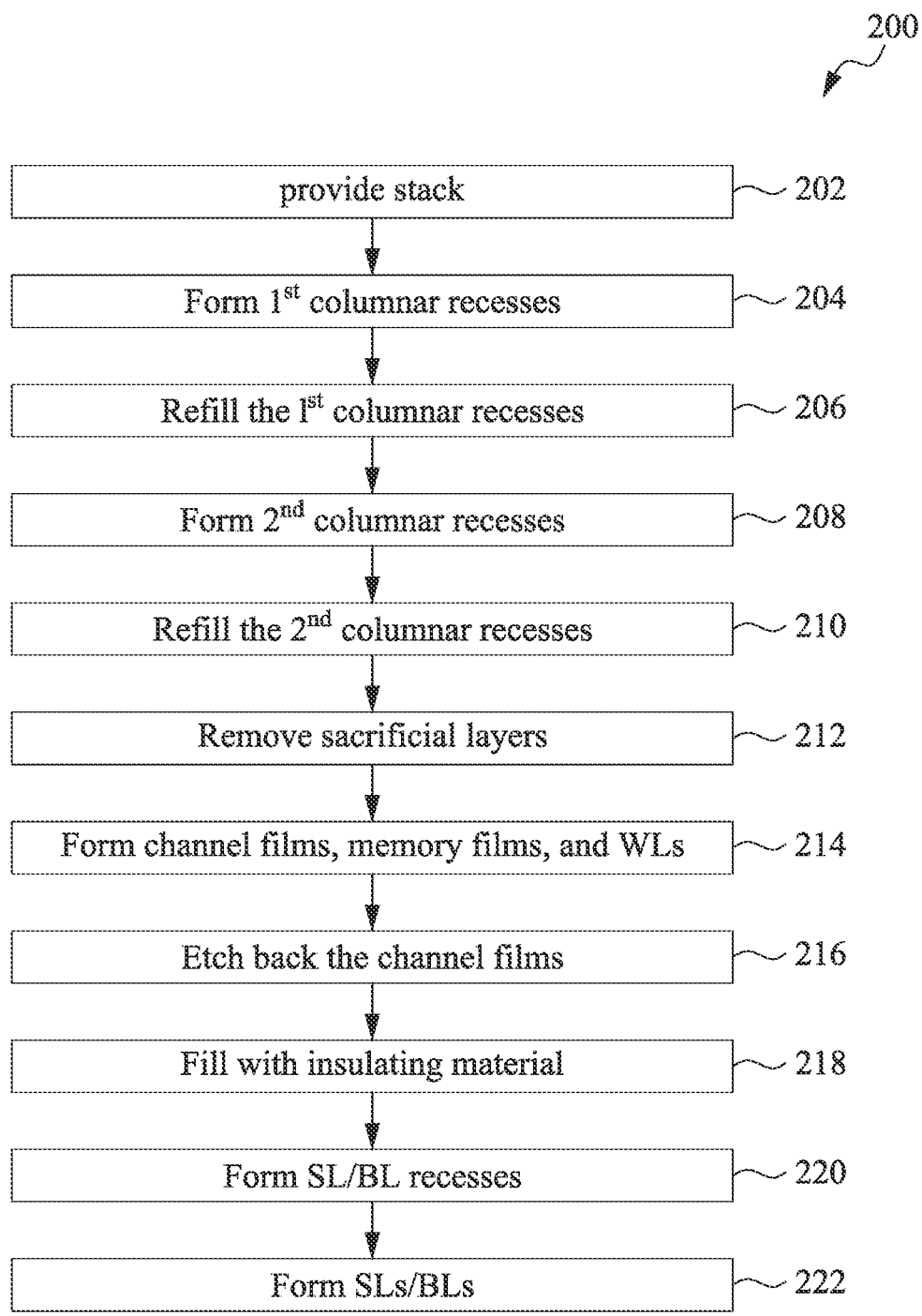
FIG. 2 illustrates a flow chart of an example method for fabricating a three-dimensional memory device including a number of memory strings of FIG. 1, in accordance with some embodiments.

FIG. 2 illustrates a flowchart of a method 200 to form a memory device, according to one or more embodiments of the present disclosure. For example, at least some of the operations (or steps) of the method 200 can be used to form a three-dimensional (3D) memory device having a number of memory strings (e.g., 100 of FIG. 1) laterally separated from each other, each of the memory strings having a number of memory cells vertically spaced from one another, and each of the memory cells having a number of memory cells operatively isolated from each other.

It is noted that the method 200 is merely an example, and is not intended to limit the present disclosure. Accordingly, it should be understood that additional operations may be provided before, during, and after the method 200 of FIG. 2, and that some other operations may only be briefly described herein. In some embodiments, operations of the method 100 may be associated with perspective views of an example 3D memory device at various fabrication stages as shown in FIGS. 3A, 3B, 4A, 4B, 5A, 5B, 6A, 6B, 7A, 7B, 8A, 8B, 9A, 9B, 10A, 10B, 11A, 11B, 12A, 12B, 13A, and 13B, respectively, which will be discussed in further detail below.

In brief overview, the method 200 starts with operation 202 of providing a stack of insulating layers and sacrificial layers over a substrate. The method 200 continues to operation 204 of forming a number of first columnar recesses. The method 200 continues to operation 206 of refilling the first columnar recesses. The method 200 continues to operation 208 of forming a number of second columnar recesses. The method 200 continues to operation 210 of refilling the second columnar recesses. The method 200 continues to operation 212 of removing sacrificial layers. The method 200 continues to operation 214 of forming semiconductor films, memory films, and WLs. The method 200 continues to operation 216 of etching back the semiconductor films. The method 200 continues to operation 218 of filling with an insulating material. The method 200 continues to operation 220 of forming SL recesses and BL recesses. The method 200 continues to operation 222 of forming SLs and BLs.

Figure 3A:
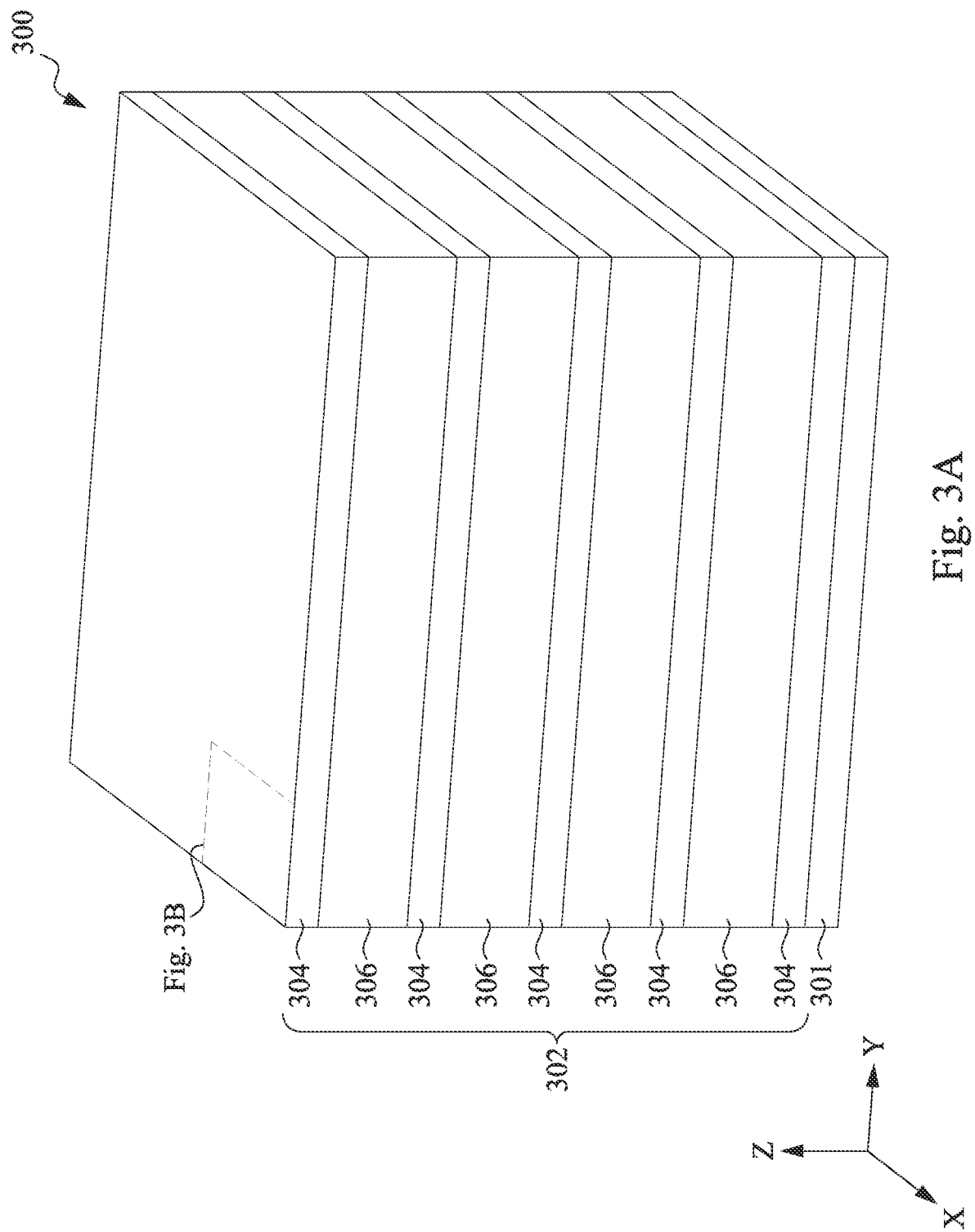
Figure 3B:
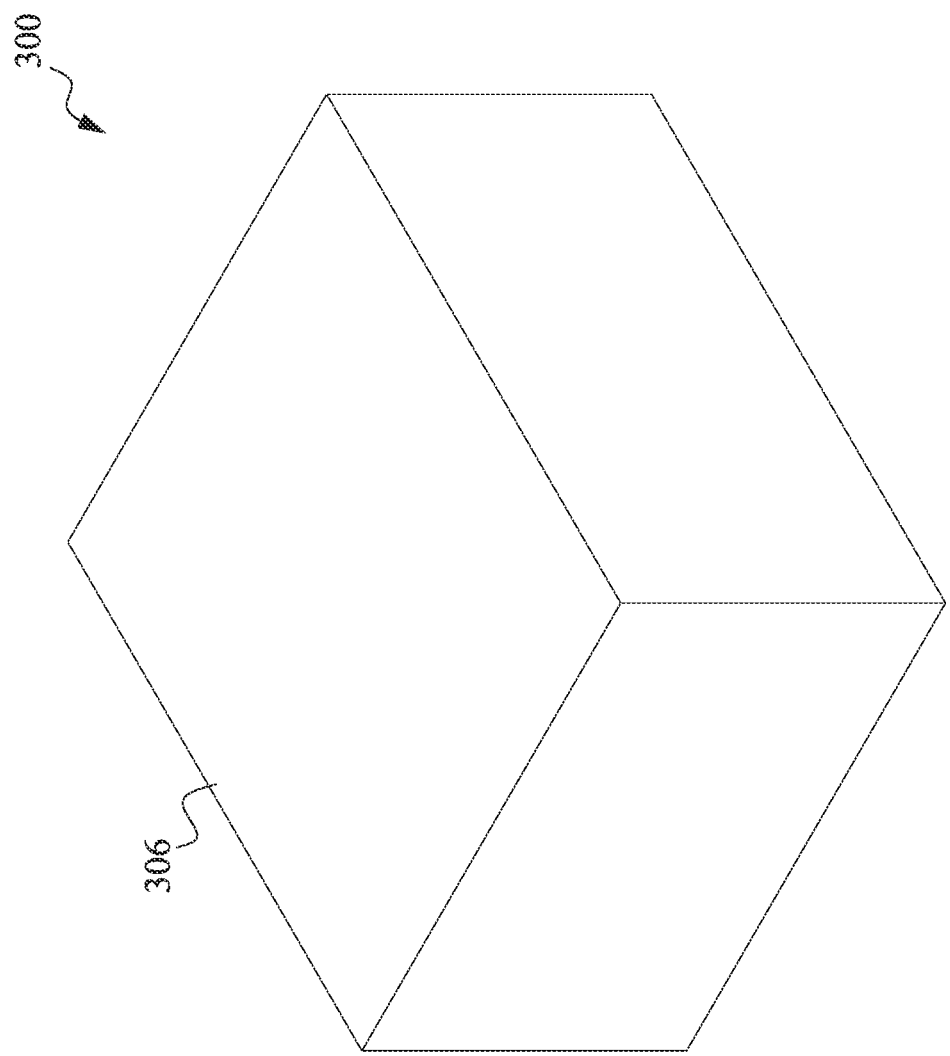

Corresponding to operation 202 of FIG. 2, FIG. 3A illustrates a perspective view of the 3D memory device 300 including a stack 302 formed over a substrate 301 at one of the various stages of fabrication, in accordance with various embodiments. FIG. 3B illustrates an enlarged view of a portion of the 3D memory device 300, e.g., one memory cell in one memory level of the device 300 (which will be described below). In some embodiments, the portion illustrated in FIG. 3B may correspond to a footprint of one of memory strings of the device 300.

The substrate 301 may be a semiconductor substrate, such as a bulk semiconductor, a semiconductor-on-insulator (SOI) substrate, or the like, which may be doped (e.g., with a p-type or an n-type dopant) or undoped. The substrate 301 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 301 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other materials are within the scope of the present disclosure. For example, the substrate 301 may include an insulating material (e.g., silicon nitride (SiN)) that function as an etch stop layer disposed over a semiconductor substrate.

The stack 302 includes a number of insulating layers 304 and a number of sacrificial layers 306 alternately stacked on top of one another over the substrate 301 along a vertical direction (e.g., the Z direction). Although five insulating layers 304 and four sacrificial layers 306 are shown in the illustrated embodiments of FIG. 3A, it should be understood that the stack 302 can include any number of insulating layers and any number of sacrificial layers alternately disposed on top of one another, while remaining within the scope of the present disclosure.

Further, although the stack 302 directly contacts the substrate 301 in the illustrated embodiment of FIG. 3A, it should be understood that the stack 302 may be separated from a top surface of the substrate 301. For example, a number of (planar and/or non-planar) transistors may be formed over the substrate 301, and a number of metallization layers, each of which includes a number of contacts electrically connecting to those transistors, may be formed between the substrate 301 and the stack 302. As used herein, the alternately stacked insulating layers 304 and sacrificial layers 306 may refer to each of the sacrificial layers 306 being adjoined by two adjacent insulating layers 304. The insulating layers 304 may have the same thickness thereamongst, or may have different thicknesses. The sacrificial layers 306 may have the same thickness thereamongst, or may have different thicknesses. In some embodiments, the stack 302 may begin with the insulating layer 304 (as shown in FIG. 3A) or the sacrificial layer 306 (in some other embodiments).

The insulating layers 304 can include at least one insulating material. The insulating materials that can be employed for the insulating layer 304 include, but are not limited to, silicon oxide (including doped or undoped silicate glass), silicon nitride, silicon oxynitride, organosilicate glass (OSG), spin-on dielectric materials, dielectric metal oxides that are generally known as high dielectric constant (high-k) dielectric oxides (e.g., aluminum oxide, hafnium oxide, etc.) and silicates thereof, dielectric metal oxynitrides and silicates thereof, and organic insulating materials. Other insulating materials are within the scope of the present disclosure. In one embodiment, the insulating layers 304 include silicon oxide.

The sacrificial layers 306 may include an insulating material, a semiconductor material, or a conductive material. The material of the sacrificial layers 306 is a sacrificial material that can be subsequently removed selective to the material of the insulating layers 304. In accordance with various embodiments, each sacrificial layer 306, sandwiched by a respective pair of insulating layers 304, may correspond to a memory level, in which a number of memory cells that are laterally disposed from one another can be formed. Non-limiting examples of the sacrificial layers 306 include silicon nitride, an amorphous semiconductor material (such as amorphous silicon), and a polycrystalline semiconductor material (such as polysilicon). In one embodiment, the sacrificial layers 306 can be spacer material layers that include silicon nitride or a semiconductor material including at least one of silicon or germanium. Other materials are within the scope of the present disclosure.

The stack 302 can be formed by alternately depositing the respective materials of the insulating layers 304 and sacrificial layers 306 over the substrate 301. In some embodiments, one of the insulating layers 304 can be deposited, for example, by chemical vapor deposition (CVD), followed by depositing such as, for example, using CVD or atomic layer deposition (ALD), one of the sacrificial layers 306. Other methods of forming the stack 302 are within the scope of the present disclosure.

Figure 4A:
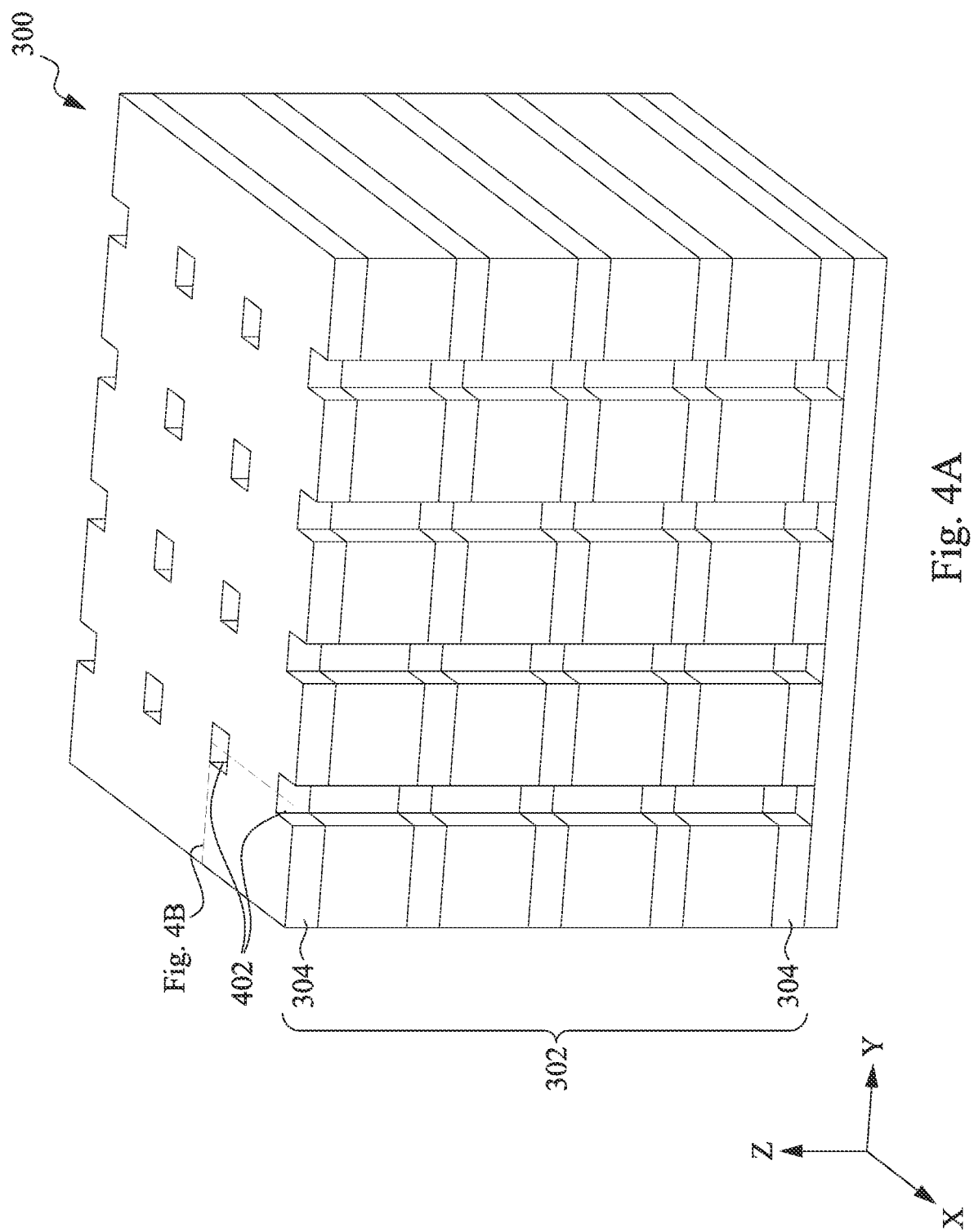
Figure 4B:
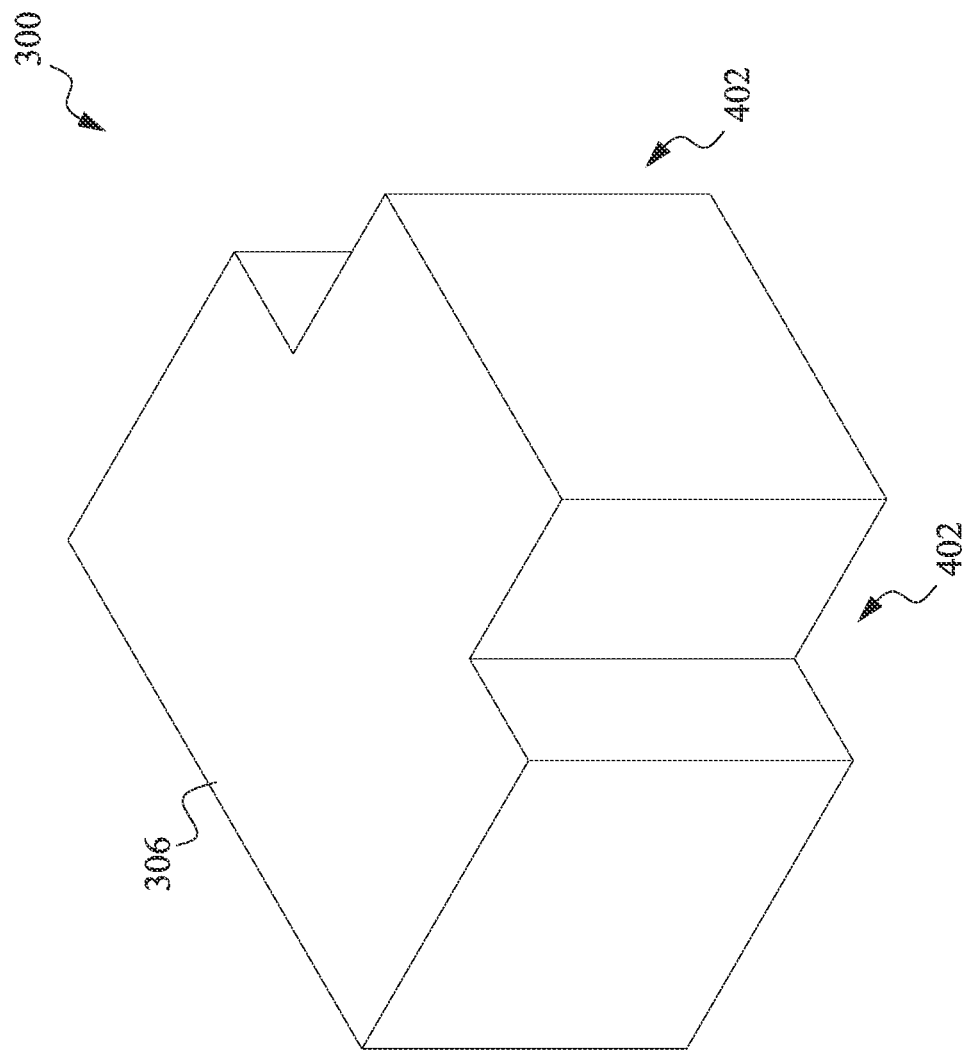

Corresponding to operation 204 of FIG. 2, FIG. 4A illustrates a perspective view of the 3D memory device 300 in which a number of first columnar recesses 402 are formed at one of the various stages of fabrication, in accordance with various embodiments. FIG. 4B illustrates an enlarged view of a portion of the 3D memory device 300, e.g., one memory cell in one memory level of the device 300. In some embodiments, the portion illustrated in FIG. 4B may correspond to a footprint of one of memory strings of the device 300.

Laterally (e.g., along the X direction or Y direction), the first columnar recesses 402 are separated from one another. For example, none of the first columnar recesses 402 may merge or otherwise contact with another one of the first columnar recesses 402, when viewed from the top. Vertically (e.g., along the Z direction), each of the first columnar recesses 402 penetrates through the stack 302. For example, the first columnar recesses 402 may each penetrate through stack 302 (e.g., from the bottommost insulating layers 304 to the topmost insulating layers 304), as shown in FIG. 4A. In some other embodiments, the first columnar recesses 402 may partially extend across the stack 302.

According to various embodiments of the present disclosure, the first columnar recesses 402 may be firstly refilled with a first insulating material (similar to the material of sacrificial layers 306), removed, and secondly refilled with a second insulating material (similar to the material of insulating layers 304), all of which will be discussed below. Upon being refilled with the second insulating material, dielectric columnar structures filling up the first columnar recesses 402 can each isolate neighboring memory strings disposed along the Y direction.

Figure 5A:
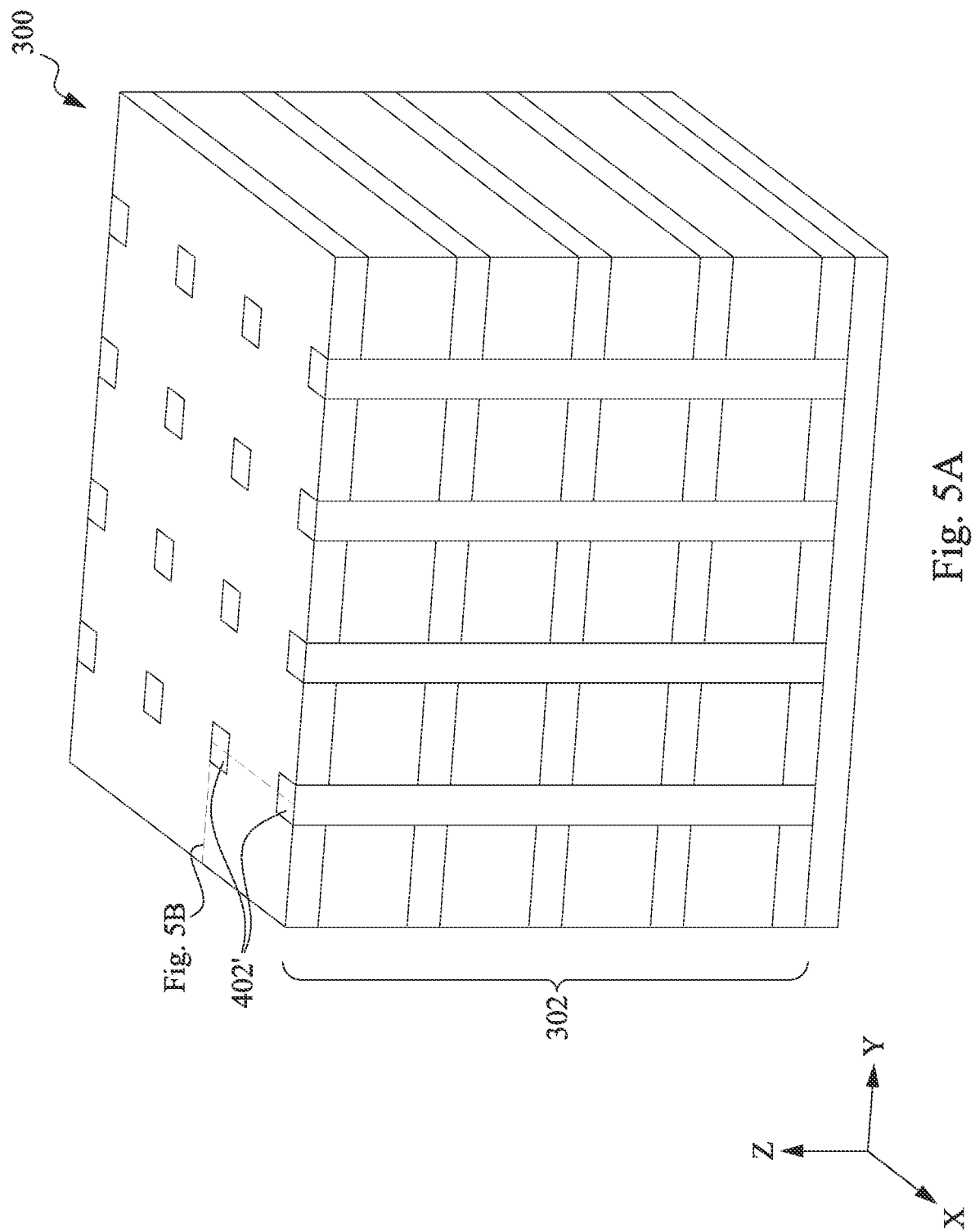

Corresponding to operation 206 of FIG. 2, FIG. 5A illustrates a perspective view of the 3D memory device 300 in which the first columnar recesses 402 are refilled at one of the various stages of fabrication, in accordance with various embodiments. FIG. 5B illustrates an enlarged view of a portion of the 3D memory device 300, e.g., one memory cell in one memory level of the device 300. In some embodiments, the portion illustrated in FIG. 5B may correspond to a footprint of one of memory strings of the device 300.

As shown, the first columnar recesses 402 are refilled with a first insulating material (e.g., the same material as the sacrificial layers 306), followed by a chemical mechanical polishing (CMP) process. Consequently, a number of interim dielectric columnar structures 402', inheriting the profiles and dimensions of the first columnar recesses 402, are formed. The first columnar recesses 402 can be refilled with the foregoing first insulating material, for example, by a conformal deposition method such as atomic layer deposition (ALD) or chemical vapor deposition (CVD). Other deposition methods are within the scope of the present disclosure.

Figure 6A:
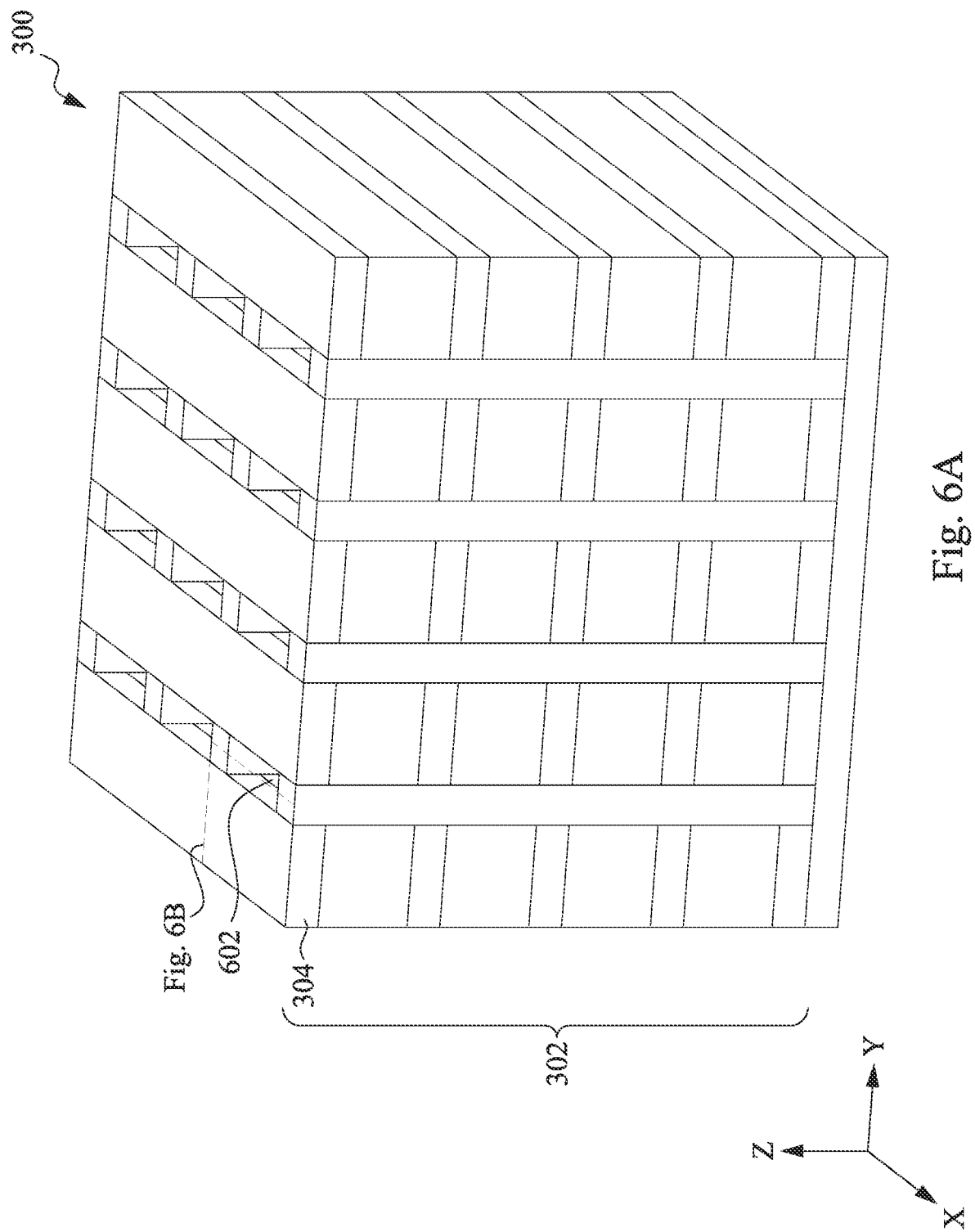
Figure 6B:
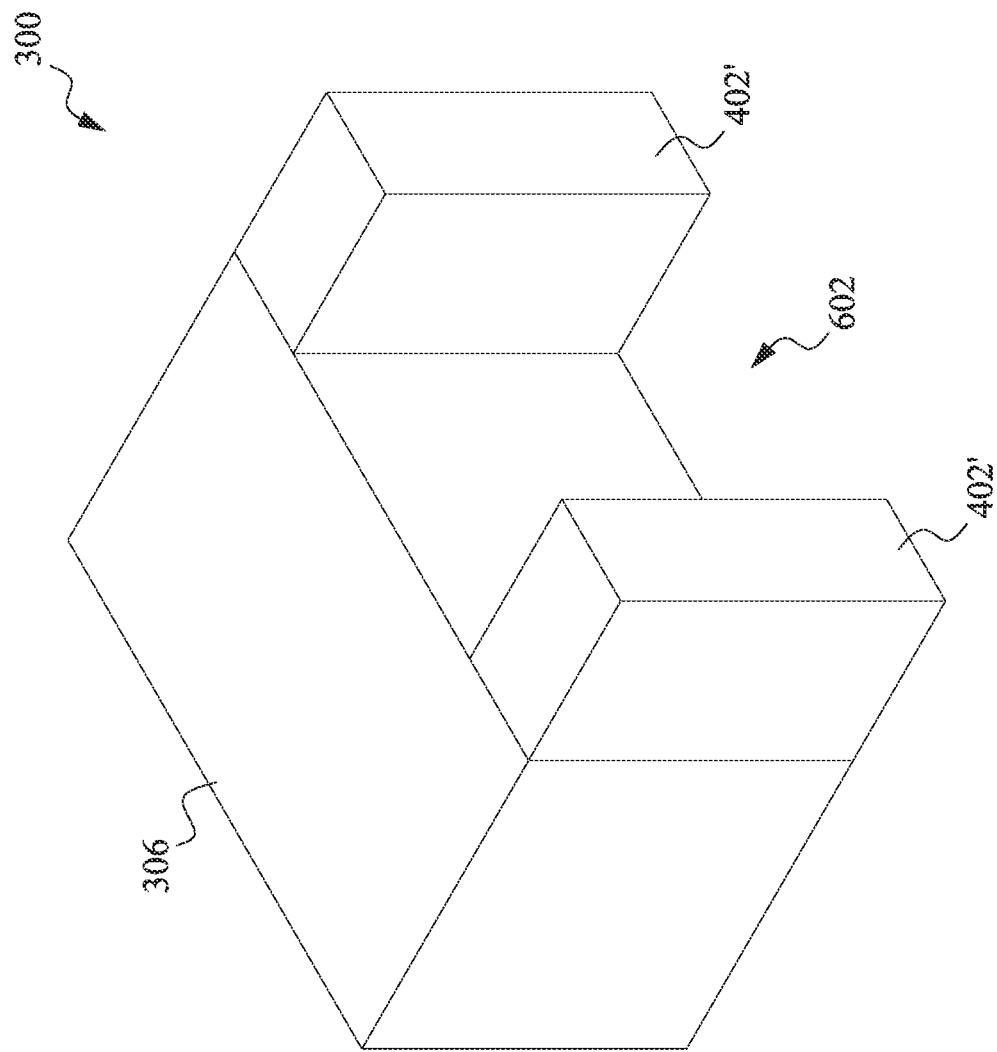

Corresponding to operation 208 of FIG. 2, FIG. 6A illustrates a perspective view of the 3D memory device 300 in which a number of second columnar recesses 602 are formed at one of the various stages of fabrication, in accordance with various embodiments. FIG. 6B illustrates an enlarged view of a portion of the 3D memory device 300, e.g., one memory cell in one memory level of the device 300. In some embodiments, the portion illustrated in FIG. 6B may correspond to a footprint of one of memory strings of the device 300.

Laterally (e.g., along the X direction or Y direction), the second columnar recesses 602 are separated from one another. For example, none of the second columnar recesses 602 may merge or otherwise contact with another one of the second columnar recesses 602, when viewed from the top. Further, each of the second columnar recesses 602 is formed between a respective pair of the interim dielectric columnar structures 402', which can be better appreciated in FIG. 6B. Vertically (e.g., along the Z direction), each of the second columnar recesses 602 penetrates through the stack 302. For example, the second columnar recesses 602 may each penetrate through stack 302 (e.g., from the bottommost insulating layers 304 to the topmost insulating layers 304), as shown in FIG. 6A. In some other embodiments, the second columnar recesses 602 may partially extend across the stack 302.

Figure 7A:
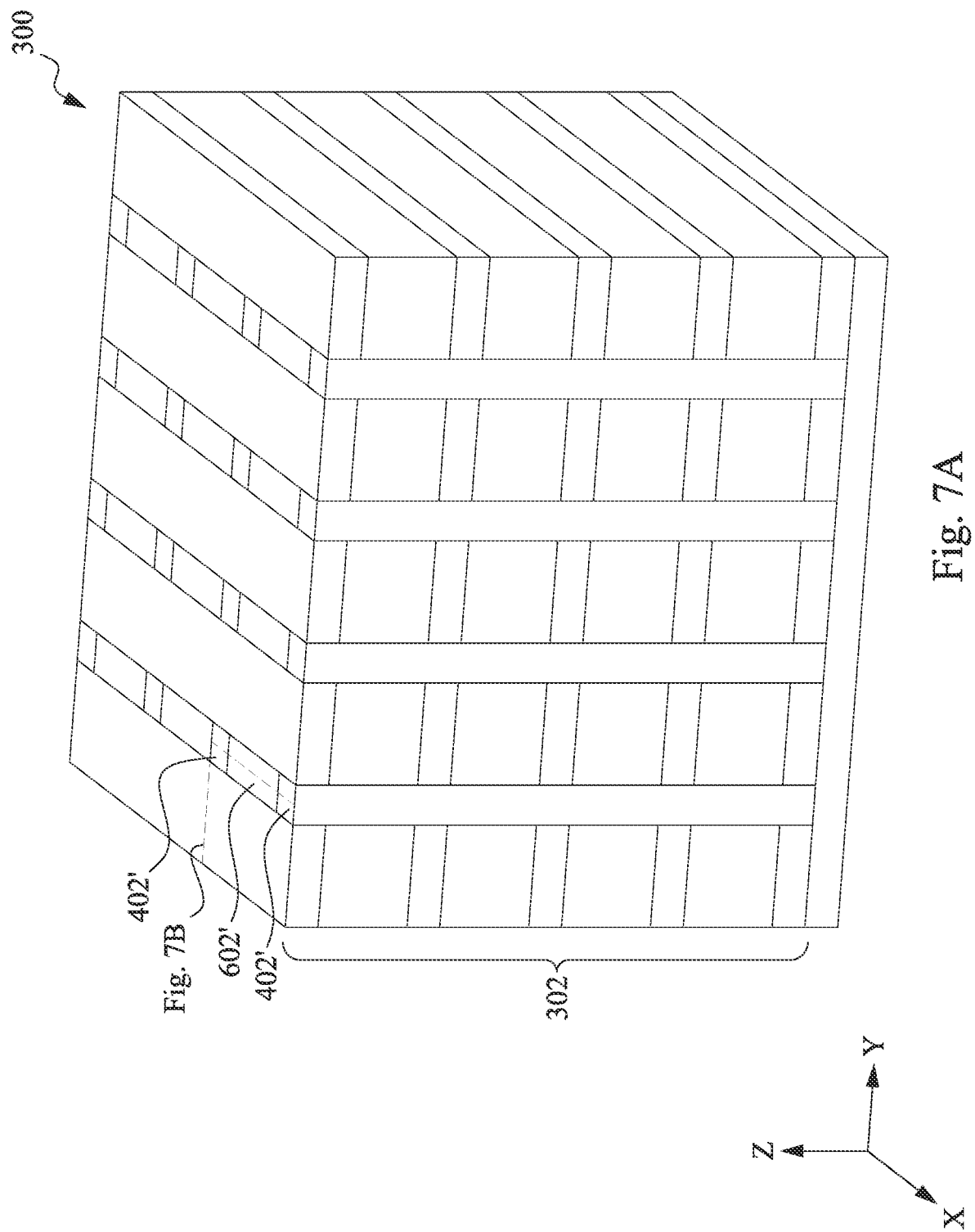
Figure 7B:
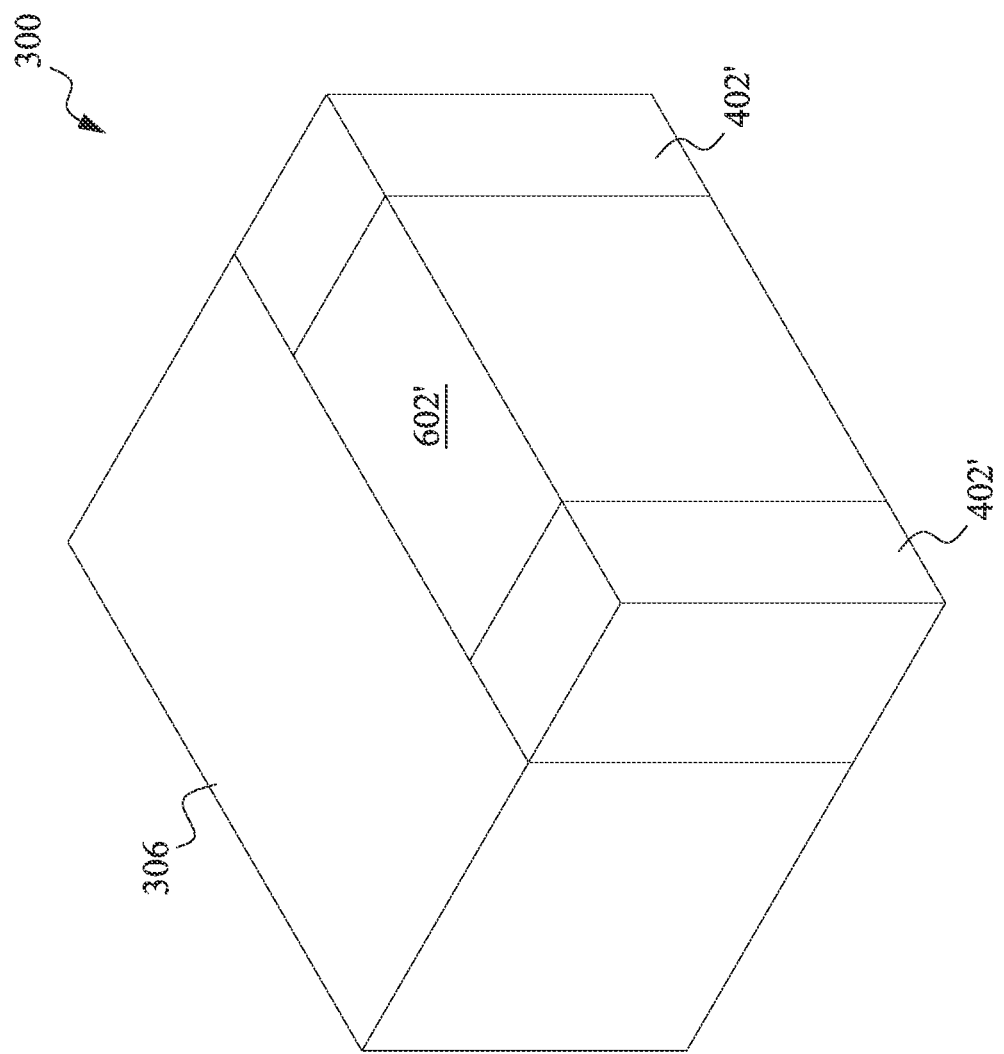

Corresponding to operation 210 of FIG. 2, FIG. 7A illustrates a perspective view of the 3D memory device 300 in which the second columnar recesses 602 are refilled at one of the various stages of fabrication, in accordance with various embodiments. FIG. 7B illustrates an enlarged view of a portion of the 3D memory device 300, e.g., one memory cell in one memory level of the device 300. In some embodiments, the portion illustrated in FIG. 7B may correspond to a footprint of one of memory strings of the device 300.

The second columnar recesses 602 are refilled with yet another insulating material (e.g., different from any of the materials of the insulating layers 304 and sacrificial layers 306), followed by a chemical mechanical polishing (CMP) process. Consequently, a number of dielectric columnar structures 602', inheriting the profiles and dimensions of the second columnar recesses 602, are formed. That is, each of the dielectric columnar structures 602' is disposed between a respective pair of the interim dielectric columnar structures 402', as better appreciated in FIG. 7B. Specifically, such an insulating material that refills the second columnar recesses 602 may be characterized with an etching selectivity with respect to the insulating layers 304 and sacrificial layers 306. As such, when etching the dielectric columnar structures 602', dielectric columnar structures formed of the material of insulating layers 304 may remain intact. Similarly, when etching the sacrificial layers 306, the dielectric columnar structures 602' may remain intact. The second columnar recesses 602 can be refilled with the foregoing insulating material, for example, by a conformal deposition method such as atomic layer deposition (ALD) or chemical vapor deposition (CVD). Other deposition methods are within the scope of the present disclosure.

Figure 8B:
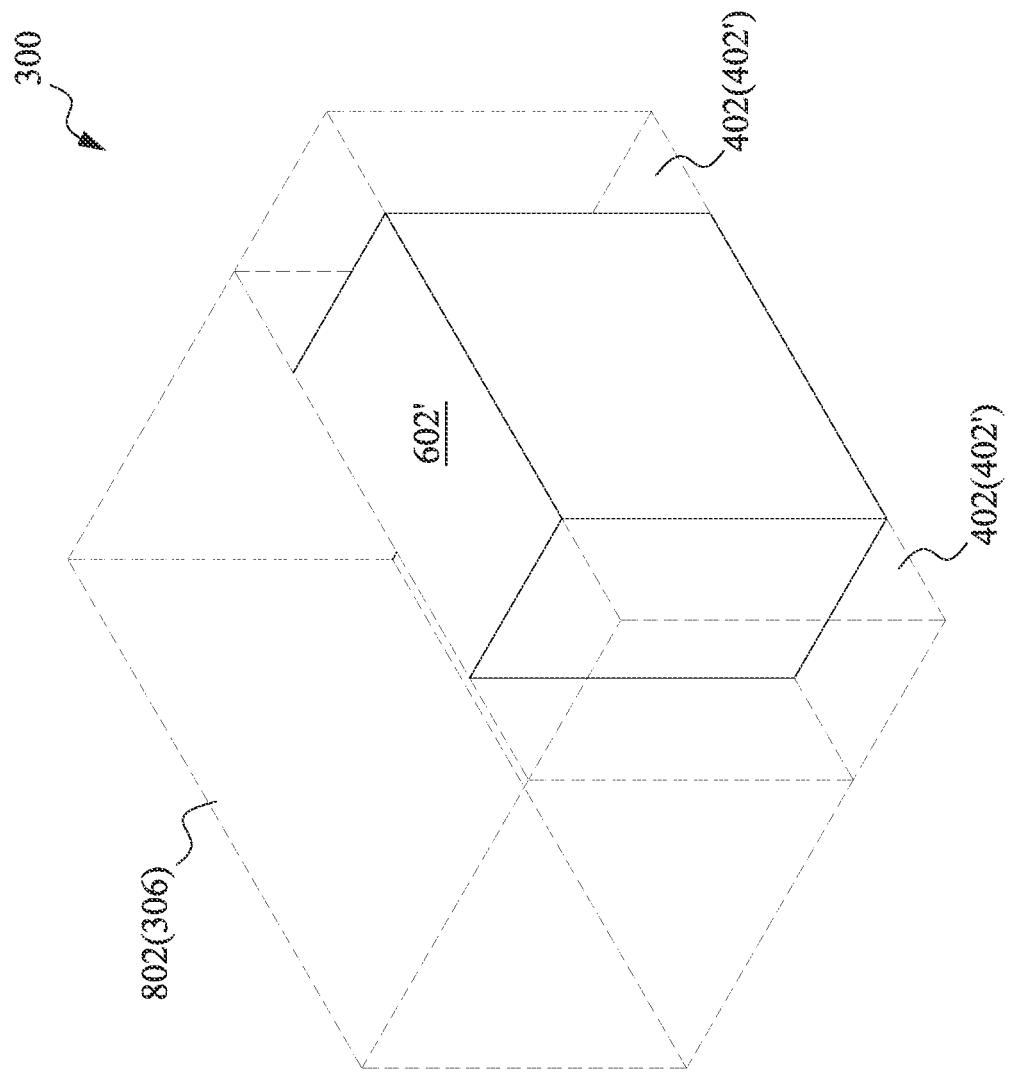

Corresponding to operation 212 of FIG. 2, FIG. 8A illustrates a perspective view of the 3D memory device 300 in which the sacrificial layers 306 (and the interim dielectric columnar structures 402' formed of the same insulating material) are removed at one of the various stages of fabrication, in accordance with various embodiments. FIG. 8B illustrates an enlarged view of a portion of the 3D memory device 300, e.g., one memory cell in one memory level of the device 300. In some embodiments, the portion illustrated in FIG. 8B may correspond to a footprint of one of memory strings of the device 300.

The (remaining) sacrificial layers 306 are recessed (e.g., removed) laterally to form a number of recesses 802. The sacrificial layers 306 can be recessed by performing an etching process (sometimes referred to as a pull-back process) that etches the sacrificial layers 306 selective to the insulating layers 304. Alternatively stated, the insulating layers 304 may remain substantially intact throughout the etching process. In some embodiments, the recess 802 can inherit the profiles and dimensions of a corresponding one of the remaining sacrificial layers 306. As such, a number of the recesses 802 are vertically separated from one another with a number of the insulating layers 304, and each recess 802 is in contact with a number of the dielectric columnar structures 602' along the X direction, as shown in FIG. 8A. Since the interim dielectric columnar structures 402' are formed of the same insulating material as the sacrificial layers 306, the interim dielectric columnar structures 402' may be concurrently removed during the foregoing etching process. Consequently, the first columnar recesses 402 may again be formed, as better appreciated in FIG. 8B.

The pull-back process can include a wet etching process employing a wet etch solution, or can be a gas phase (dry) etching process in which the etchant is introduced in a vapor phase over the stack 302. In the example where the sacrificial layers 306 include silicon nitride and the insulating layers 304 include silicon oxide, the pull-back process can include a wet etching process in which the workpiece is immersed within a wet etch tank that includes phosphoric acid ($H_3PO_4$), which etches silicon nitride of the sacrificial layer 306 selective to silicon oxide and various other materials of the insulating layers 304. Other methods of etching the sacrificial layer 306 are within the scope of the present disclosure. As discussed above, since the dielectric columnar structures 602' are formed of another insulating material that has an etching selectivity with respect to the sacrificial layers 306, the dielectric columnar structures 602' can remain substantially intact, as shown in FIGS. 8A-B.

Figure 9A:
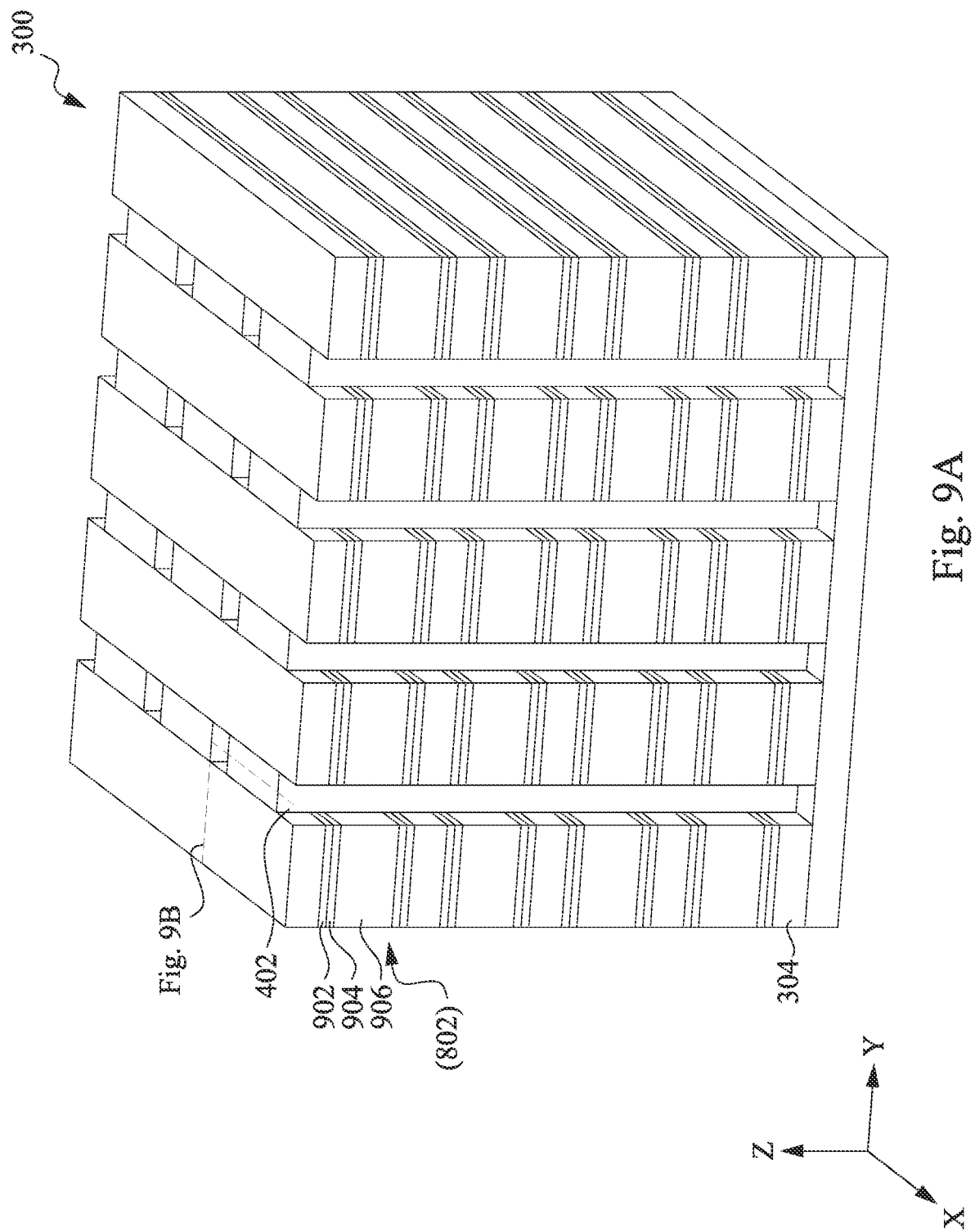
Figure 9B:
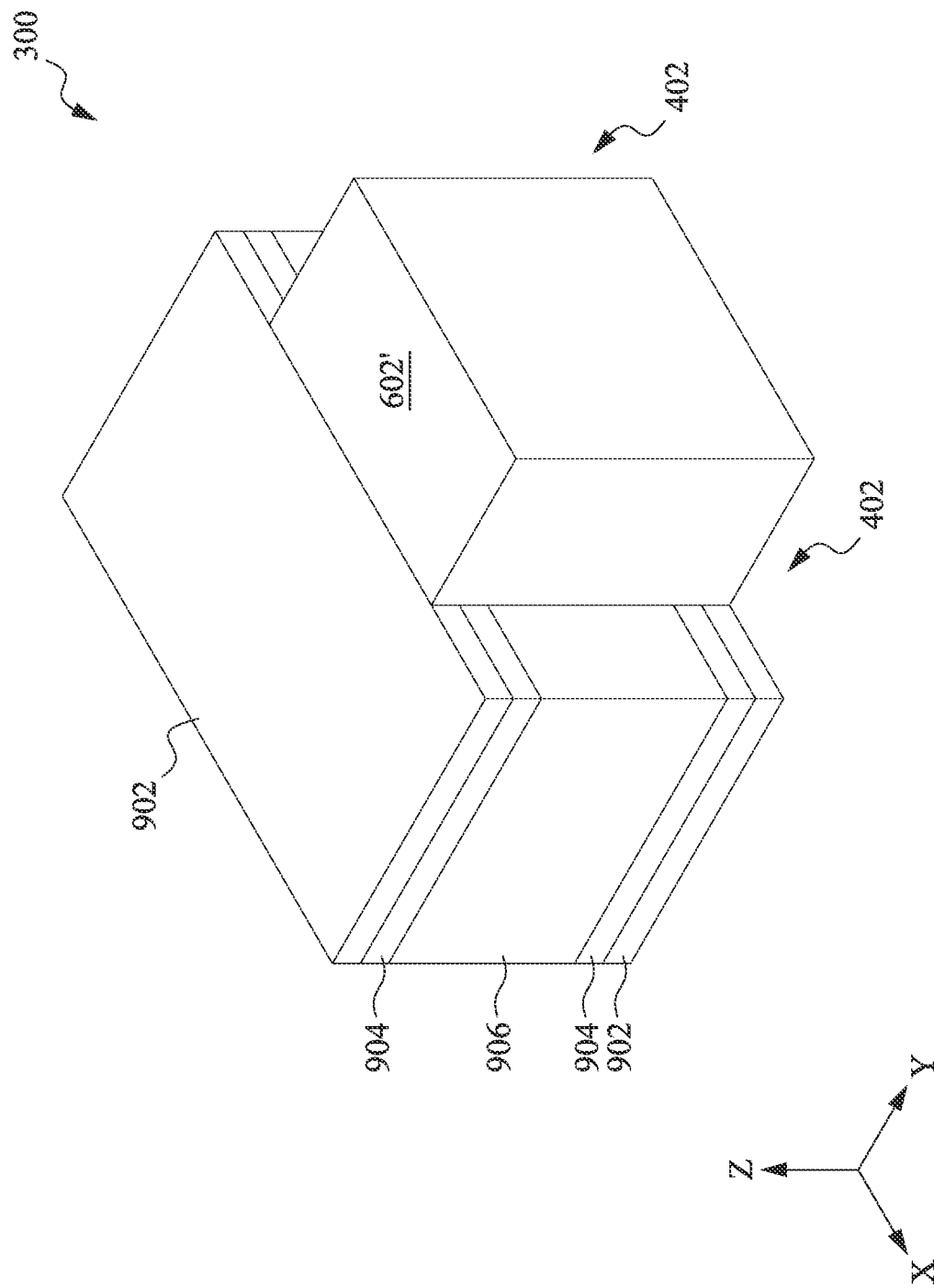

Corresponding to operation 214 of FIG. 2, FIG. 9A illustrates a perspective view of the 3D memory device 300 including semiconductor films 902, memory films 904, and conductor structures (e.g., WLs) 906 at one of the various stages of fabrication, in accordance with various embodiments. FIG. 9B illustrates an enlarged view of a portion of the 3D memory device 300, e.g., one memory cell in one memory level of the device 300. In some embodiments, the portion illustrated in FIG. 9B may correspond to a footprint of one of memory strings of the device 300.

In some embodiments, the semiconductor films 902, memory films 904, and WLs 906 shown in FIGS. 9A-B are formed by at least some of the following processes: depositing a (e.g., conformal) semiconductor channel layer over the recesses 802 and 402; depositing a (e.g., conformal) memory layer over the semiconductor channel layer; depositing a conductive (e.g., metal) material to fill the remaining portions of the recesses 802 and 402; and etching back portions of the semiconductor channel layer, memory layer, and conductive material in the recesses 402 to form the semiconductor films 902, memory films 904, and WLs 906.

As such, each of the semiconductor films 902, memory films 904, and WLs 906 can extend along the X direction. Each of the semiconductor films 902, together with a corresponding one of the memory films 904 and a corresponding one of the WLs 906, can be disposed in one of the memory levels of the stack 302. Further, each of the semiconductor films 902 can wrap around portions of a corresponding one of the WLs 906, with a corresponding one of the memory films 904 interposed therebetween. Such a wrapped portion of the WL 906 can correspond to a position of one of the dielectric columnar structures 602'. Alternatively stated, the semiconductor film 902 has multiple portions each extending along one sidewall of each of a number of the dielectric columnar structures 602' that are arranged along the X direction. Such a sidewall faces either toward or away from the Y direction. Laterally next to the portions of the semiconductor film 902 (e.g., in the Y direction), the memory film 904 has multiple corresponding portions that each wrap around the WL 906 at the positions of the dielectric columnar structures 602'. Such a wrapped-around configuration can be better appreciated in the perspective view of FIG. 1 and the cross-sectional views of FIG. 14A.

The foregoing semiconductor channel layer, used to form the semiconductor films 902, may include a doped or undoped semiconductor material such as, for example, Si (e.g., polysilicon or amorphous silicon), Ge, SiGe, silicon carbide (SiC), indium gallium zinc oxide (IGZO), indium tin oxide (ITO), indium zinc oxide (IZO), indium tungsten oxide (IWO), or combinations thereof. The semiconductor channel layer can be deposited (as a blanket layer) over the workpiece as a continuous liner structure, for example, by a conformal deposition method such as atomic layer deposition (ALD) or chemical vapor deposition (CVD). Other deposition methods are within the scope of the present disclosure.

The foregoing memory layer, used to form the memory films 904, may include a ferroelectric material such as, for example, lead zirconate titanate (PZT), $PbZr/TiO_3$, $BaTiO_3$, $PbTiO_2$, or combinations thereof, in one of various embodiments. However, it should be understood that the memory layer can include any of various other materials that are suitable as in memory devices, while remaining within the scope of the present disclosure. For example, the memory layer can include a material selected from the group consisting of: $HfO_2$, $Hr_{1-x}Zr_xO_2$, $ZrO_2$, $TiO_2$, $NiO$, $TaO_x$, $Cu_2O$, $Nb_2O_5$, $AlO_x$, and combinations thereof. Following the formation of the (blanket) semiconductor channel layer, the memory layer (as a blanket layer) can be deposited over the workpiece as a continuous liner structure, for example, by a conformal deposition method such as atomic layer deposition (ALD) or chemical vapor deposition (CVD). Other deposition methods are within the scope of the present disclosure.

The foregoing metal material, used to form the WLs 906, may be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The WLs 909 can be formed by overlaying the workpiece with the above-listed metal material by, for example, chemical vapor deposition (CVD), physical vapor deposition (PVD), electroless plating, electroplating, or combinations thereof. This can be followed by an etching back process to remove the excess metal material, excess semiconductor channel layer, and excess memory layer in the recesses 402, as mentioned above. Other methods of forming the WLs 906 are within the scope of the present disclosure.

Figure 10A:
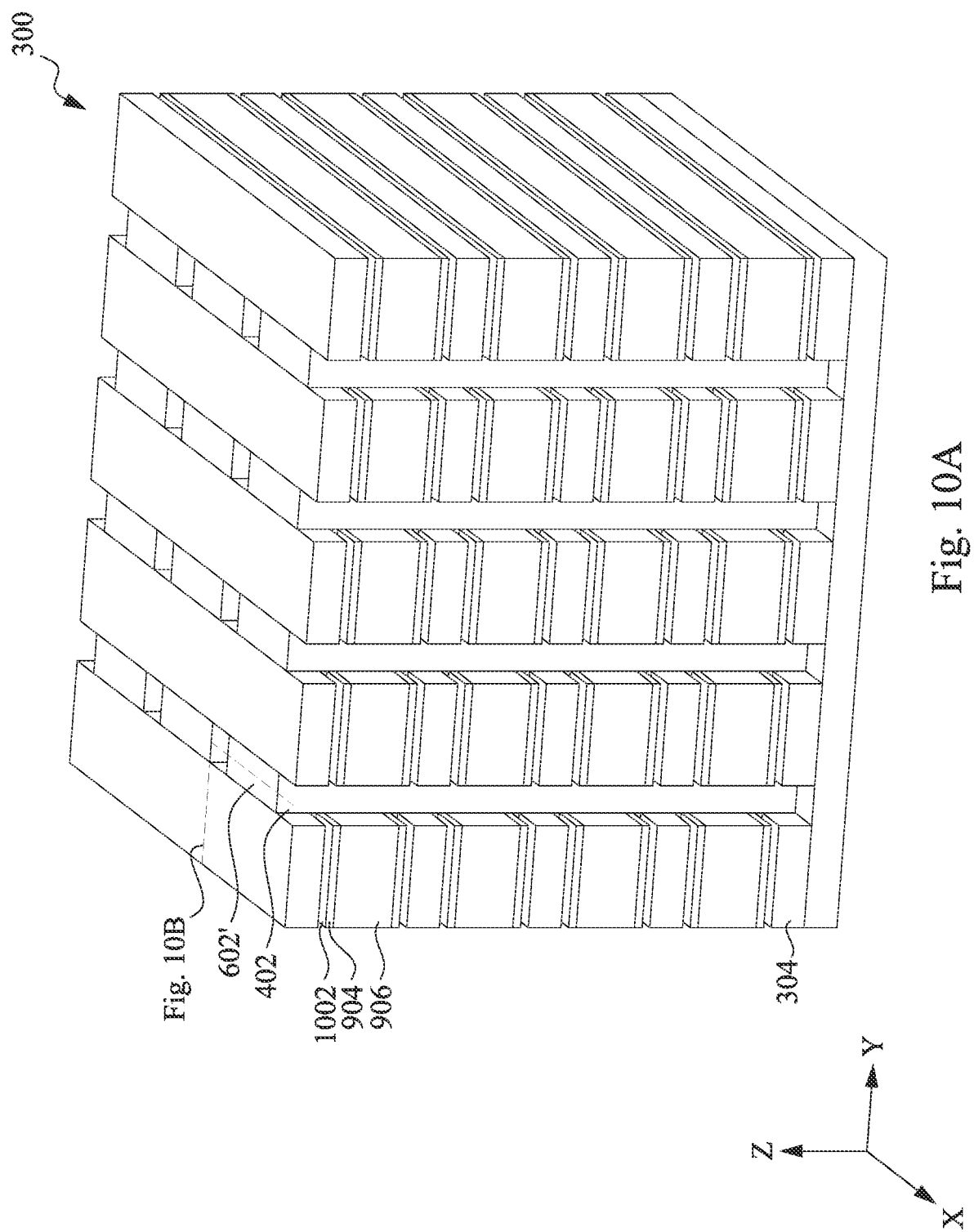
Figure 10B:
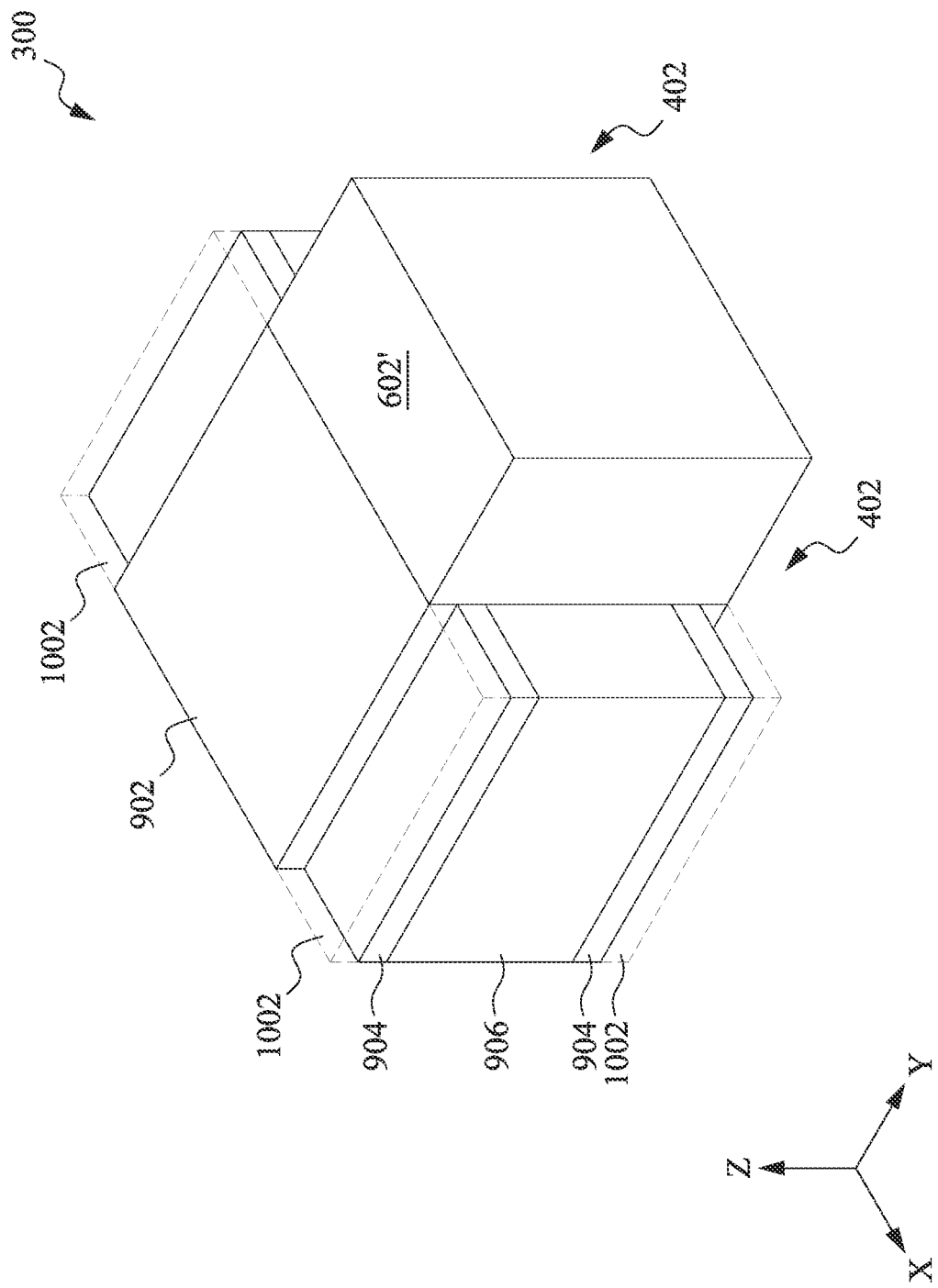

Corresponding to operation 216 of FIG. 2, FIG. 10A illustrates a perspective view of the 3D memory device 300 in which each of the semiconductor films 902 is etched back at one of the various stages of fabrication, in accordance with various embodiments. FIG. 10B illustrates an enlarged view of a portion of the 3D memory device 300, e.g., one memory cell in one memory level of the device 300. In some embodiments, the portion illustrated in FIG. 10B may correspond to a footprint of one of memory strings of the device 300.

Figure 14A:
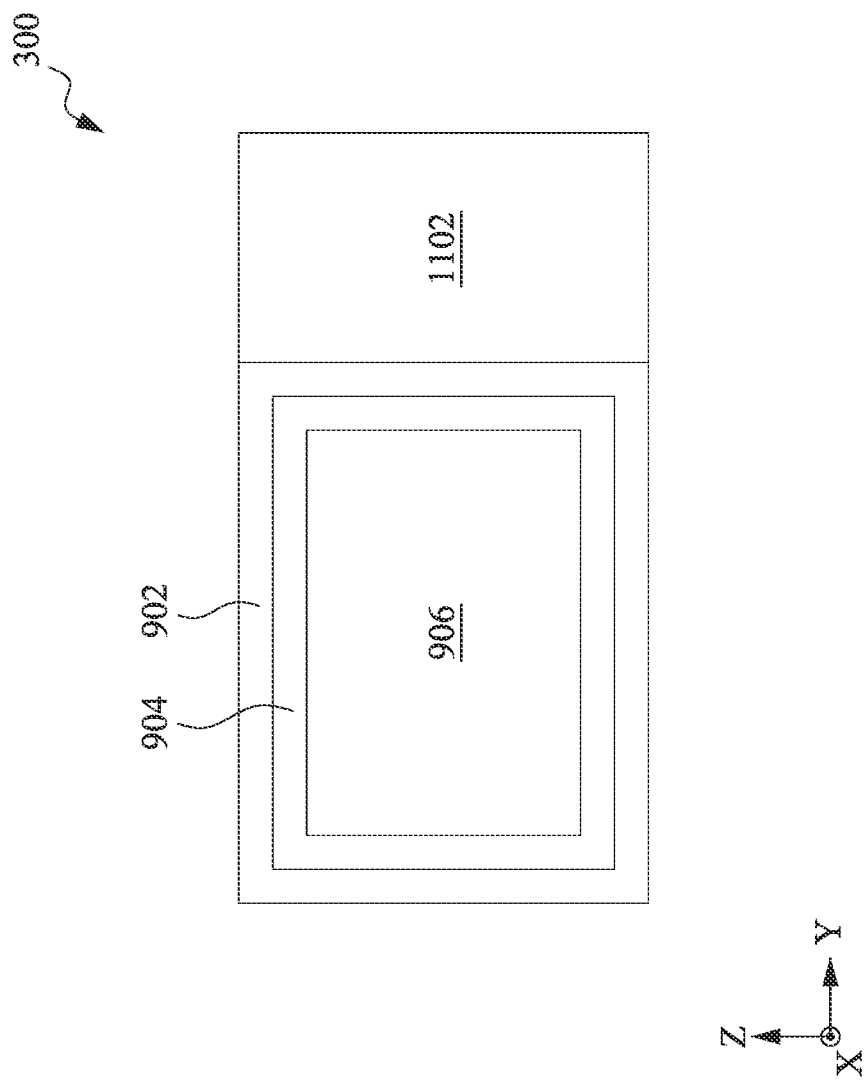
FIGS. 14A, 14B, and 14C illustrate various cross-sectional views of a portion of the example three-dimensional memory device shown in FIGS. 3A to 13B, in accordance with some embodiments.

In some embodiments, portions of the semiconductor film 902 that extend beyond any of the dielectric columnar structures 602' along the X direction are etched back (e.g., removed). As such, recesses 1002 are formed. As better seen in FIG. 10B, portions of the semiconductor film 902 that extend beyond the dielectric columnar structure 602' along the X direction are removed, thereby forming the recesses 1002. As such, the memory film 904 and WL 906 may each extend beyond the etched semiconductor film 902 along the X direction. However, it should be noted that the remaining portion of the semiconductor film 902 may still wrap around a portion of the WL 906 with a portion of the memory film 904 interposed therebetween, as illustrated in FIGS. 1 and 14A.

Figure 11A:
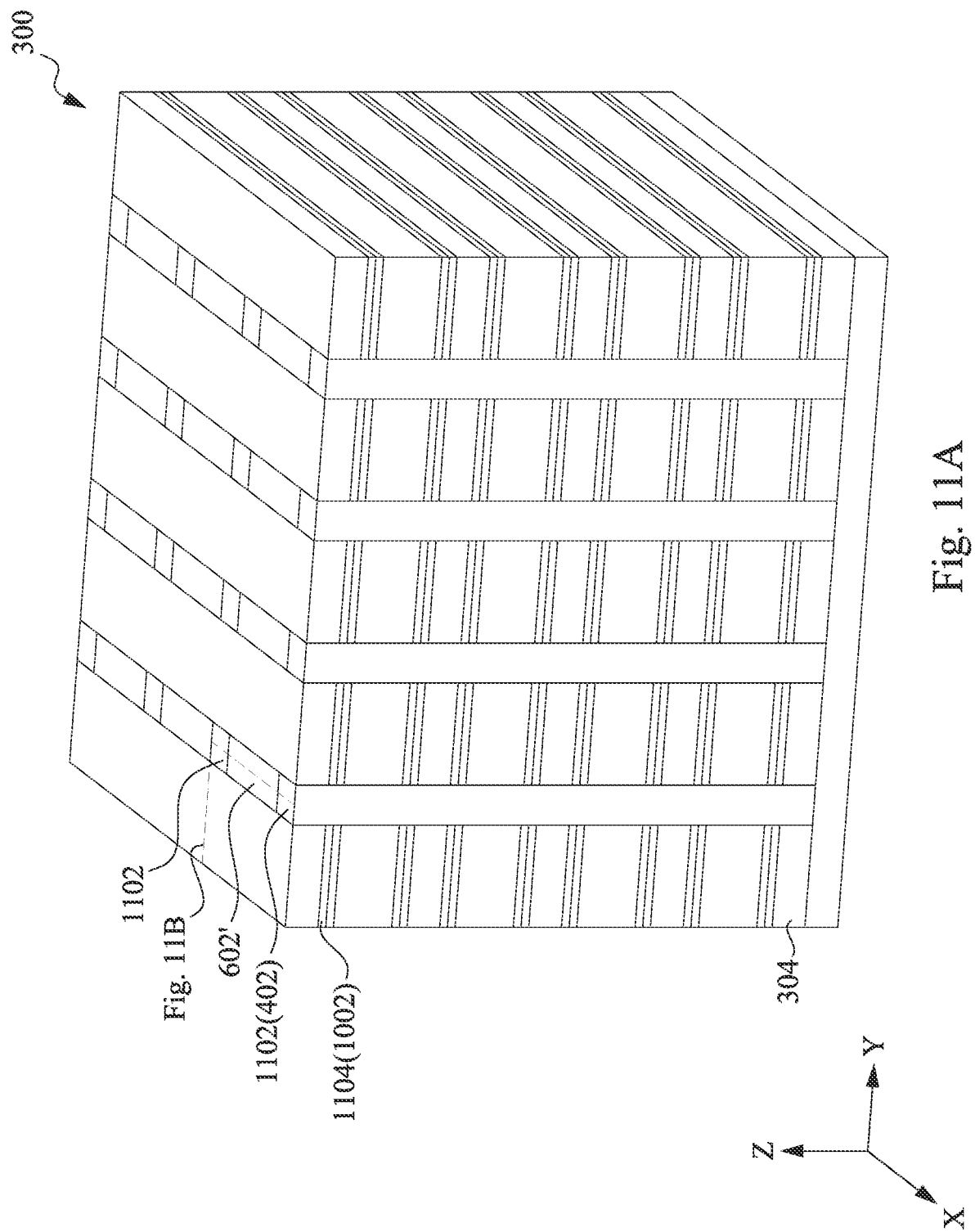
Figure 11B:
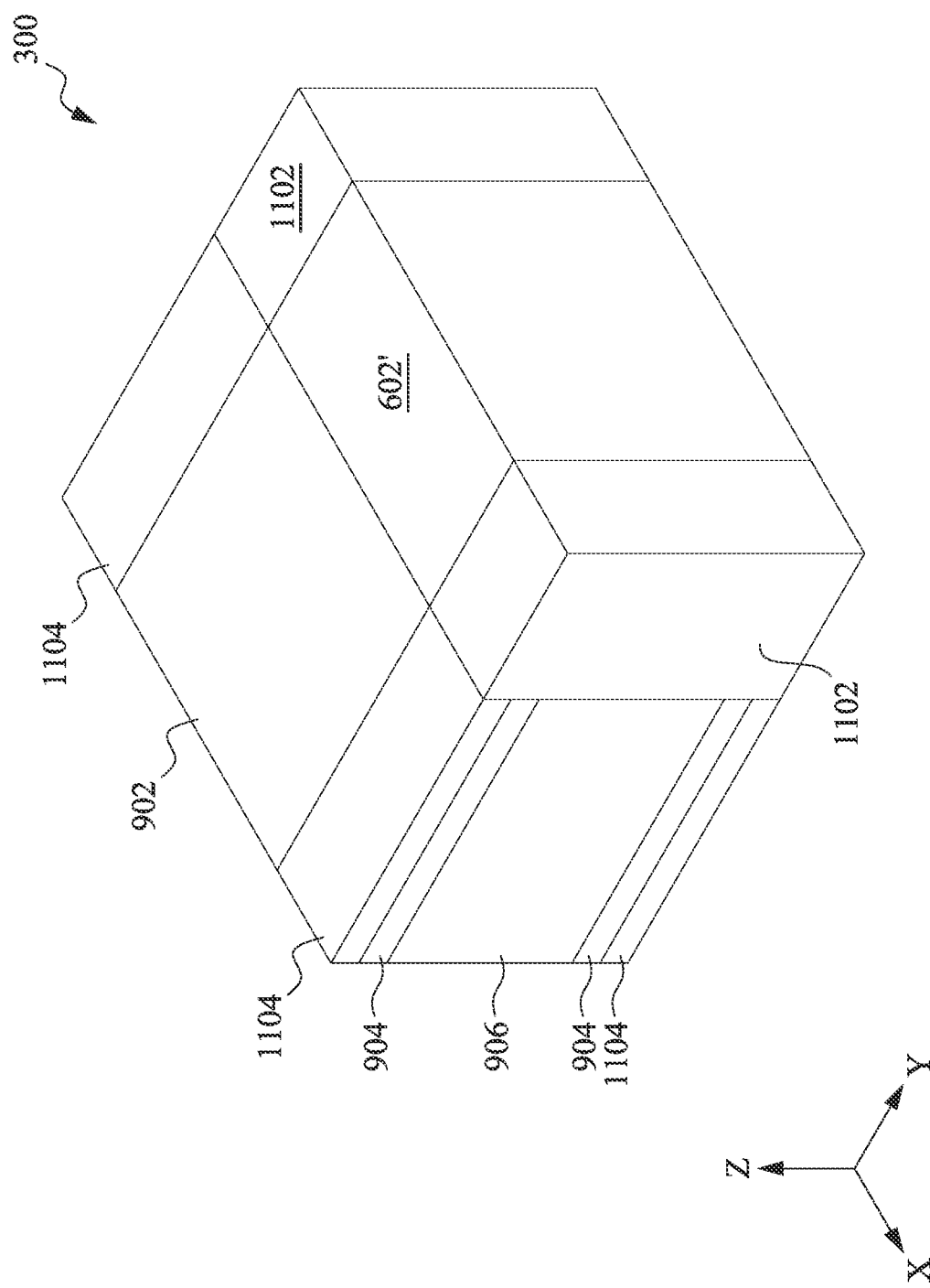

Corresponding to operation 218 of FIG. 2, FIG. 11A illustrates a perspective view of the 3D memory device 300 in which the recesses 402 and 1002 are refilled at one of the various stages of fabrication, in accordance with various embodiments. FIG. 11B illustrates an enlarged view of a portion of the 3D memory device 300, e.g., one memory cell in one memory level of the device 300. In some embodiments, the portion illustrated in FIG. 11B may correspond to a footprint of one of memory strings of the device 300.

In some embodiments, the first columnar recesses 402 and recesses 1002 can be refilled with a second insulating material, for example, by a conformal deposition method such as atomic layer deposition (ALD) or chemical vapor deposition (CVD). Other deposition methods are within the scope of the present disclosure. The second insulating material may be similar as the material of the insulating layers 304, according to various embodiments. As a result, the dielectric columnar structures 602' can be interposed between a pair of dielectric columnar structures 1102 that inherit the profiles and dimensions of the corresponding pair of first columnar recesses 402, as shown in FIGS. 11A-B. Further, dielectric structures 1104 that inherit the profiles and dimensions of the recesses 1002 can be formed. Such dielectric structures 1104 can electrically isolate each of the semiconductor films 902 from another, e.g., along the X direction.

Figure 12A:
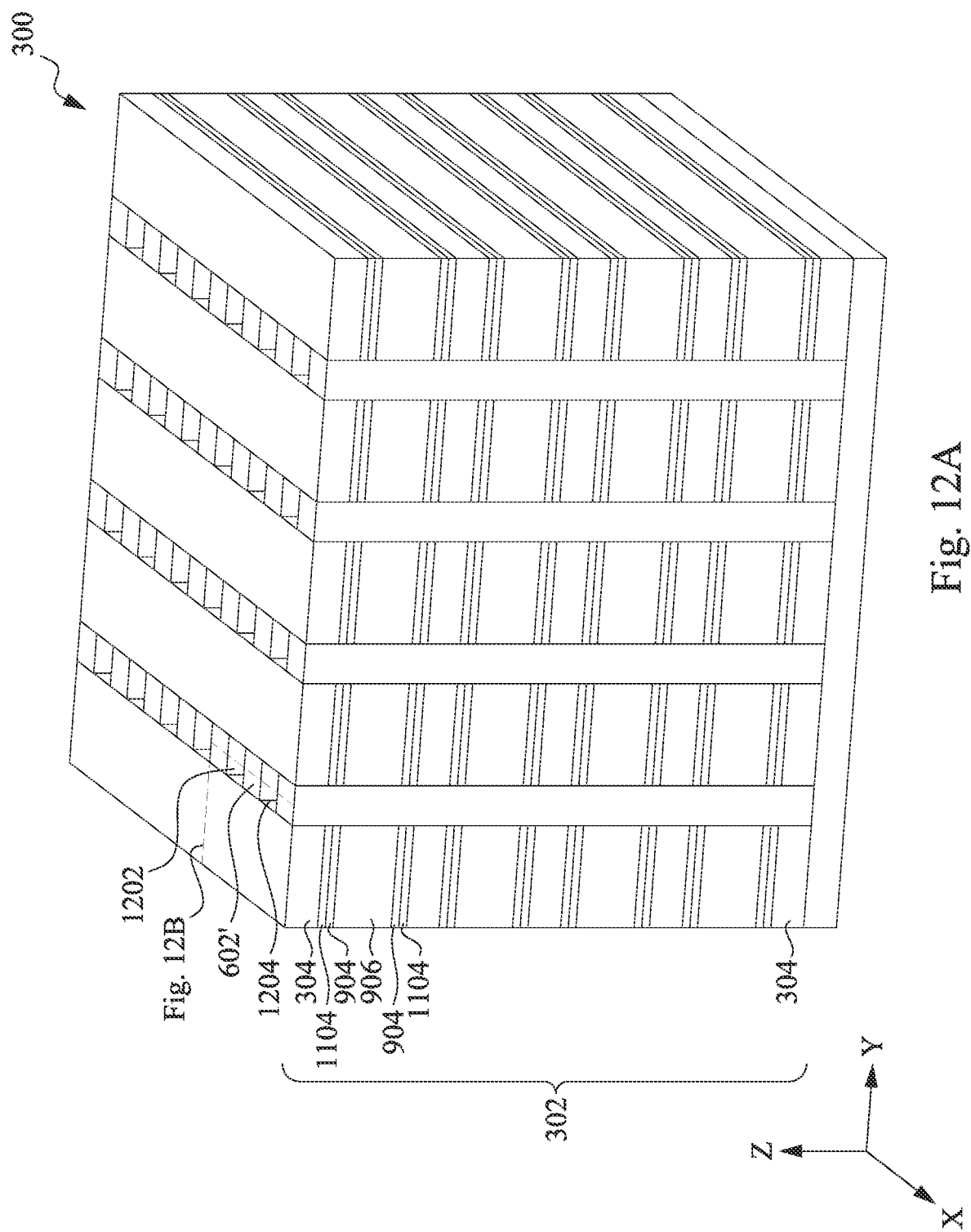
Figure 12B:
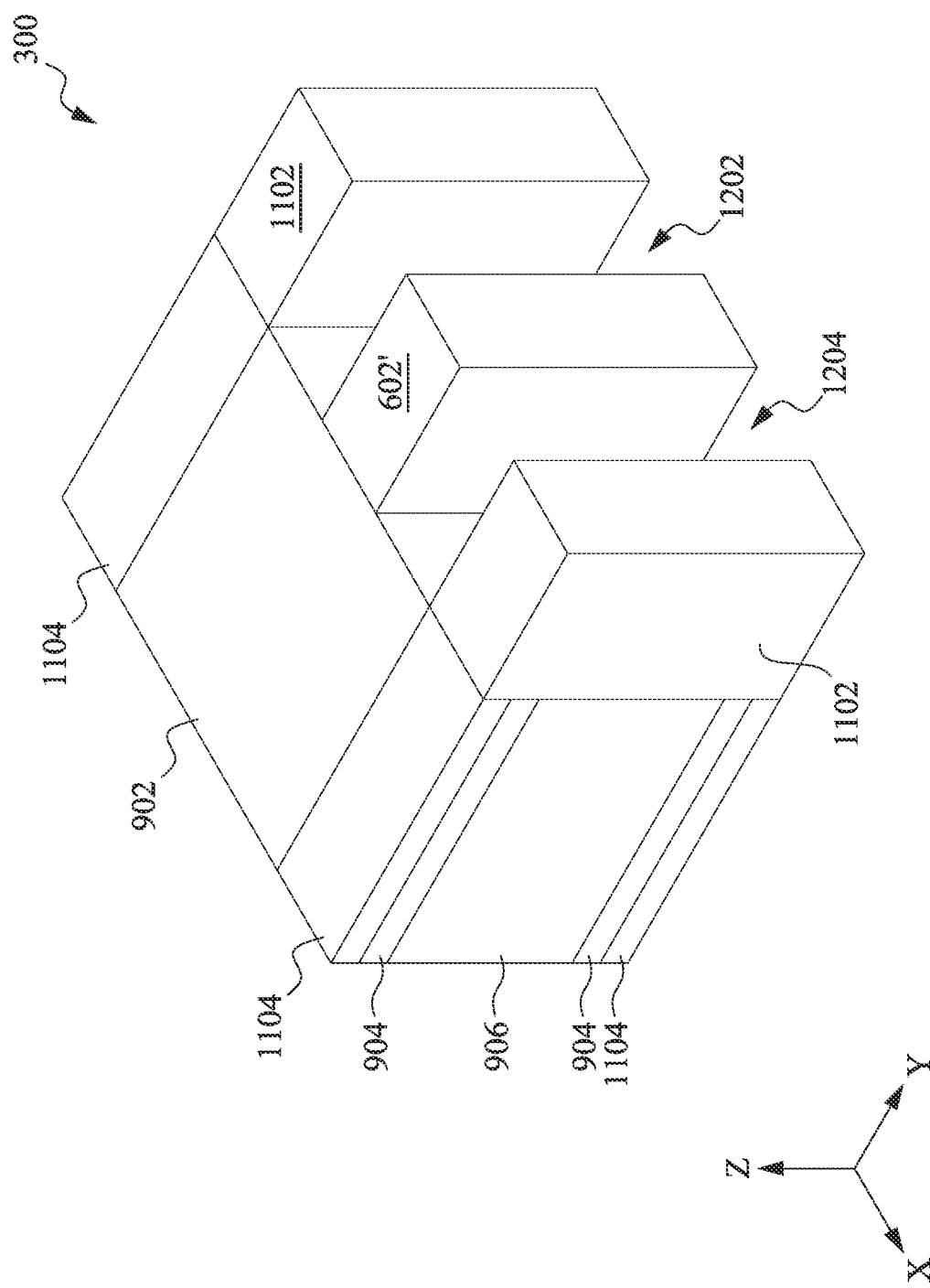

Corresponding to operation 220 of FIG. 2, FIG. 12A illustrates a perspective view of the 3D memory device 300 including a number of recesses 1202 and a number of recesses 1204 at one of the various stages of fabrication, in accordance with various embodiments. FIG. 12B illustrates an enlarged view of a portion of the 3D memory device 300, e.g., one memory cell in one memory level of the device 300. In some embodiments, the portion illustrated in FIG. 12B may correspond to a footprint of one of memory strings of the device 300.

The recesses 1202 will be later refilled with a conductive material to form a number of BLs, and thus, the recesses 1202 are herein referred to as BL recesses 1202. Similarly, the recesses 1204 will be later refilled with the same conductor material to form a number of SLs, and thus, the recesses 1204 are herein referred to as SL recesses 1204. The BL recesses 1202 and SL recesses 1204 each vertically extend through the stack 302, e.g., from the bottommost insulating layers 304 to the topmost insulating layers 304.

Further, in some embodiments, each of the BL recesses 1202 may be formed by a corresponding one of the SL recesses 1204 by etching end portions of one of the dielectric columnar structures 602' (along the X direction). As such, upon being formed, such a pair of the BL recess 1202 and SL recess 1204 can expose portions of one of the "isolated" semiconductor films 902, respectively. As better appreciated in FIG. 12B, following the formation of the BL recess 1202 and SL recess 1204, (e.g., end) portions of a sidewall of the semiconductor film 902 are exposed. Such a sidewall can face toward or away from the Y direction.

Figure 13A:
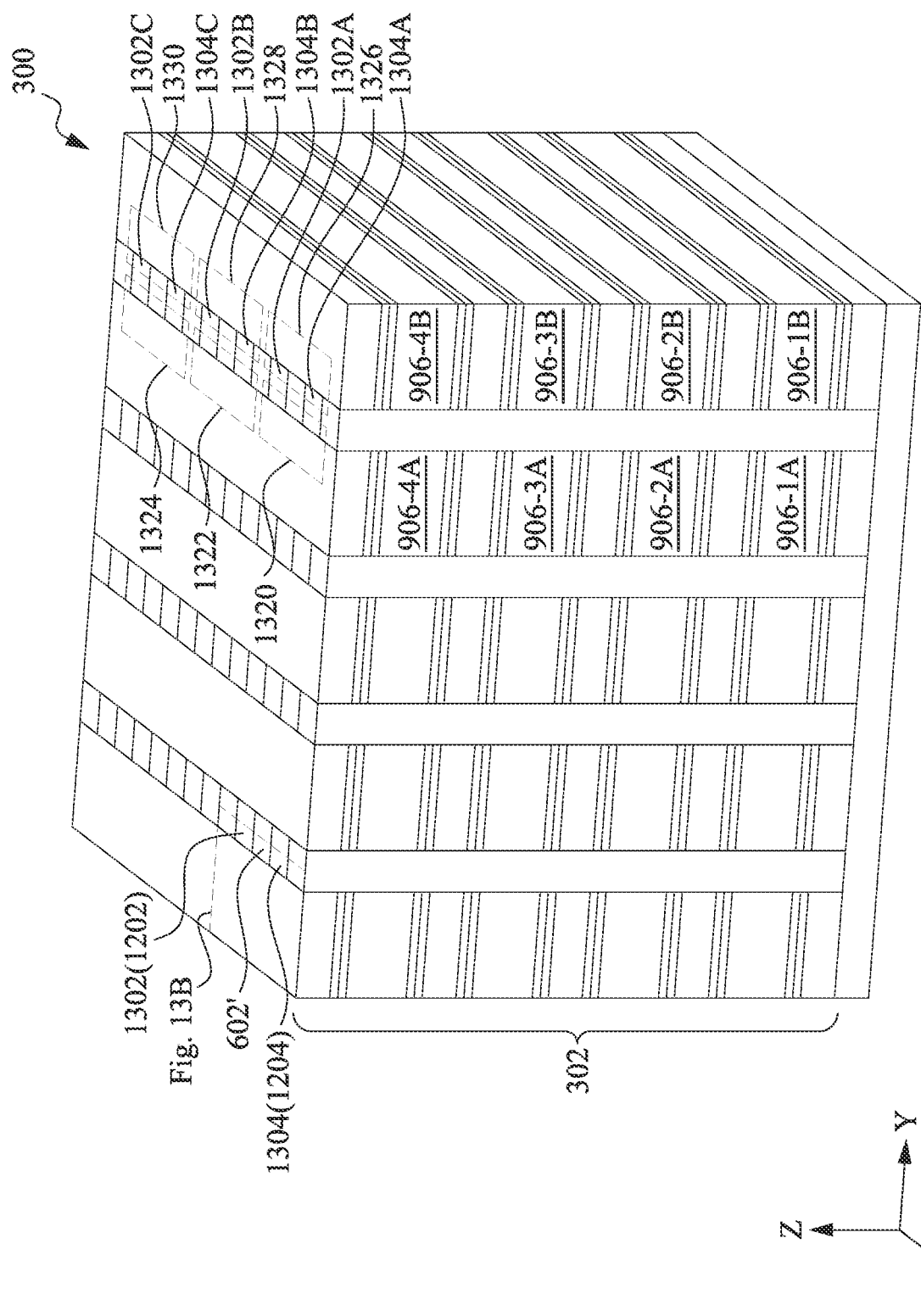
Figure 13B:
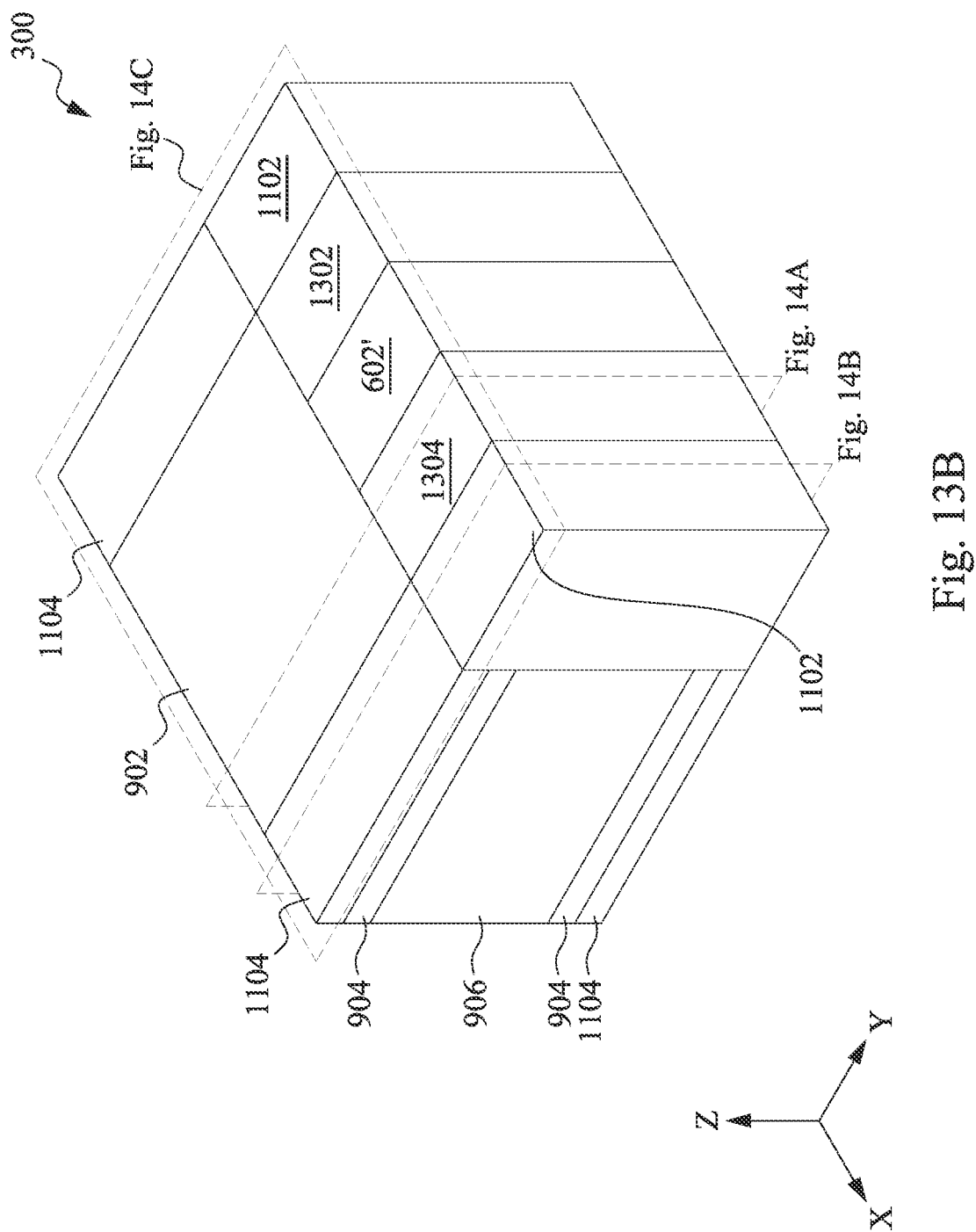

Corresponding to operation 222 of FIG. 2, FIG. 13A illustrates a perspective view of the 3D memory device 300 including conductor structures (e.g., BLs) 1302 and conductor structures (e.g., SLs) 1304 at one of the various stages of fabrication, in accordance with various embodiments. FIG. 13B illustrates an enlarged view of a portion of the 3D memory device 300, e.g., one memory cell in one memory level of the device 300. In some embodiments, the portion illustrated in FIG. 13B may correspond to a footprint of one of memory strings of the device 300.

As mentioned above, the BLs 1302 and SLs 1304 are formed by refilling the recesses 1202 and 1204 with a conductive material, respectively. Such a conductive material can include a metal material or a semiconductor material. The example metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. Non-limiting examples of such a semiconductor material include Si (e.g., polysilicon or amorphous silicon), Ge, SiGe, silicon carbide (SiC), indium gallium zinc oxide (IGZO), indium tin oxide (ITO), indium zinc oxide (IZO), indium tungsten oxide (IWO), or combinations thereof. The BLs 1302 and SLs 1304 can be formed by overlaying the workpiece (e.g., to fill the BL and SL recesses) with the above-listed metal or semiconductor material by, for example, chemical vapor deposition (CVD), physical vapor deposition (PVD), electroless plating, electroplating, or combinations thereof. This can be followed by a CMP process. Other methods of forming the BLs and SLs are within the scope of the present disclosure.

Upon forming the BLs 1302 and SLs 1304, a number of memory cells can be formed. Referring to FIG. 13B, a memory cell, constituted by the WL 906, the memory film 904, the semiconductor film 902, the BL 1302, and the SL 1304, is formed. In various embodiments, the semiconductor film 902 can function as a channel of the memory film that is configured to conduct electricity upon being turned on. The WL 906 can function as a gate (terminal) of the memory cell that is configured to turn on/off the channel (semiconductor film 902) through the memory film 904, which functions as a gate dielectric of the memory cell. The BL 1302 and SL 1304, which respectively contact the channel (semiconductor film 902), can function as a source (terminal) and a drain (terminal) of the memory cell.

Figure 14B:
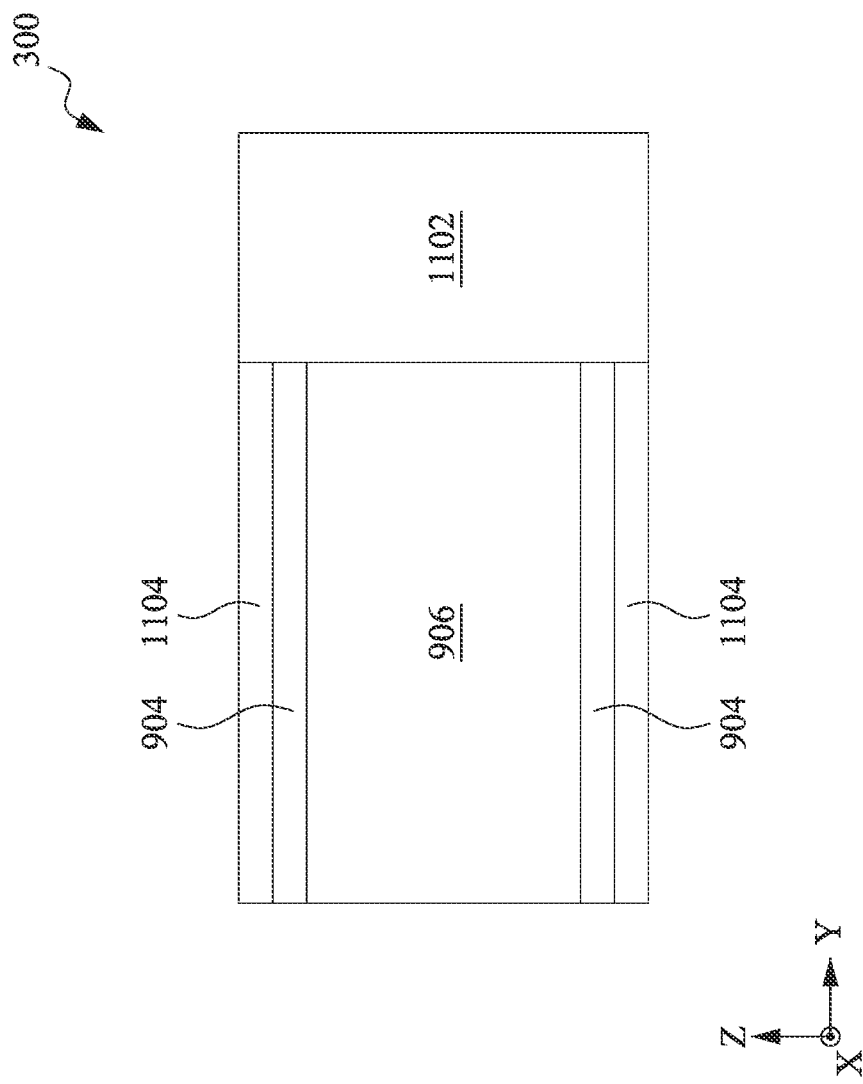
Figure 14C:
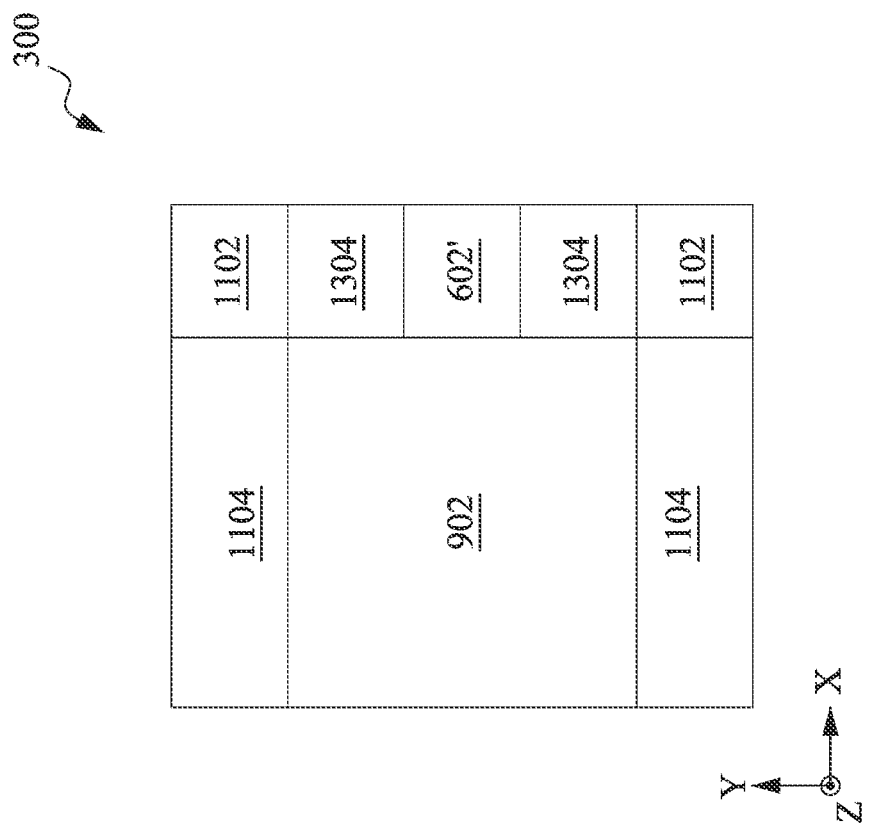

To further illustrate the disclosed configuration where each of the WLs can confine its electrical fields within a corresponding semiconductor channel, various cross-sectional views of the memory cell shown in FIG. 13B are illustrated in FIGS. 14A, 14B, and 14C, respectively. For example, FIG. 14A illustrates a cross-sectional view of the memory cell cut along the Y-Z plane and across the SL 1304; FIG. 14B illustrates a cross-sectional view of the memory cell cut along the Y-Z plane and across the dielectric structures 1102 and 1104; and FIG. 14C illustrates a cross-sectional view of the memory cell cut along the X-Y plane and across the dielectric structures 1102 and 1104.

As shown in FIG. 14A, the semiconductor film 902 wraps around the WL 906, with the memory film 904 interposed therebetween. Further, a portion of one of the sidewalls of the semiconductor film 902 (facing toward the Y direction as shown) is in contact with the SL 1304. Given such a symmetrical structure (e.g., FIG. 13A), it should be appreciated that on the other sidewall of the semiconductor film 902 (facing away from the Y direction), there should be another SL in contact with it, thereby defining another memory cell.

Referring next to FIG. 14B, the semiconductor film 902 is not observable, as such a portion extending beyond the pre-etched dielectric columnar structure 602' has been replaced by the dielectric structure 1104 (as discussed with respect to FIGS. 11A-B). Accordingly, in this cross-section, instead of being wrapped around by the semiconductor film 902, the WL 906 is wrapped by a combination of the memory film 904 and the dielectric structure 1102. For example, a top surface and bottom surface of the WL 906 are in contact with different portions of the memory film 904, respectively; and sidewalls of the WL 906 are in contact with a pair of the dielectric structures 1102 (one of which is not shown in FIG. 14B).

Referring then to FIG. 14C, an upper portion of the semiconductor film 902 (i.e., the portion vertically disposed above the WL 906 and memory film 904) is isolated from other semiconductor films along the Y direction by the dielectric structures 1104. As the BL 1302 and SL 1304 each continuously extend across multiple memory levels, the upper portion of the semiconductor film 902 can still be in contact with those access lines. It should be understood that a lower portion of the semiconductor film 902 (i.e., the portion vertically disposed below the WL 906 and memory film 904) can have a configuration substantially similar as that shown in FIG. 14C, and thus, the descriptions are not repeated.

Referring again to FIG. 13A, upon forming the BLs 1302 and SLs 1304 across the stack 302, a three-dimensional (3D) memory array including a number of memory strings (e.g., 100 of FIG. 1) can be formed. As shown, memory strings 1320, 1322, 1324, 1326, 1328, and 1330 are selected as an representative example. It should be understood that the 3D memory array can include any number of memory strings, while remaining within the scope of the present disclosure.

Each of the memory strings has a number of memory cells, each of which is disposed in a respective memory level with a corresponding WL 906. For example, the memory strings 1320 to 1304, disposed along the X direction (i.e., a lengthwise direction of the WLs 906), each have four memory cells disposed in respective memory levels such as, a first level sharing WL 906-1A, a second level sharing WL 906-2A, a third level sharing WL 906-3A, and a fourth level 906-4A. Alternatively stated, each of the memory strings 1302 to 1304 has a first memory cell gated by the WL 906-1A, a second memory cell gated by the WL 906-2A, a third memory cell gated by the WL 906-3A, and a fourth memory cell gated by the WL 906-4A, while the respective memory cells of the memory strings 1302 to 1304 at a certain memory level share one of the WLs 906-1A to 906-4A. Similarly, the memory strings 1326 to 1330, disposed along the X direction (i.e., a lengthwise direction of the WLs 906), each have four memory cells disposed in respective memory levels such as, a first level sharing WL 906-1B, a second level sharing WL 906-2B, a third level sharing WL 906-3B, and a fourth level 906-4B. Further, the memory strings 1320 and 1326, disposed adjacent each other along the Y direction, share a pair of BL 1302A and SL 1304A. Similarly, the memory strings 1322 and 1328 share a pair of BL 1302B and SL 1304B; and the memory strings 1324 and 1330 share a pair of BL 1302C and SL 1304C.

FIGS. 15A, 15B, 15C, and 15D illustrate various other embodiments of the memory device 300, respectively, in the cross-section cut along the Y-Z plane and across one of the SL 1304/BL1302 (similar as FIG. 14A). As shown in FIG. 15A, each of the semiconductor film 902, the memory film 904, and the WL 906 has at least one of its inner and/or outer corners with a curvature profile. Specifically, four inner corners of the semiconductor film 902 each present a curvature profile; four inner and outer corners of the memory film 904 each present a curvature profile; and four outer corners of the WL 906 each present a curvature profile. Such a curvature profile may be formed during the sequential depositions of the above-mentioned semiconductor layer, memory layer, and the WL metal. For example, after the semiconductor layer (which is later patterned to become the semiconductor film 902) is formed as having inner corners present the curvature profile, the memory layer (which is later patterned to become the memory film 904) and the WL metal (which is later patterned to become the WL 906) may follow such a curvature profile.

Next, in each of FIGS. 15B-D, the WL 906 has a void (e.g., filled with air) embedded therein. For example, in FIG. 15B, the WL 906 has a void 1502 in a circle shape; in FIG. 15C, the WL 906 has a void 1504 in an ellipse shape having its long axis along the Z direction; and in FIG. 15D, the WL has a void 1506 in an ellipse shape having its long axis along the Y direction. Such a void may be formed during the deposition of the WL metal, where the recess 802 (FIGS. 9A-B) may not be fully filled with the WL metal. Alternatively stated, the void can be "spontaneously" formed within a formed WL. Thus, it should be understood that the void can have any of various other shapes (e.g., an irregular shape, an ellipse shape having its long axis along a direction between the Z direction and Y direction, a rectangle shape, etc.) and/or be formed within any position of a WL, while remaining within the scope of the present disclosure.

Figure 16B:
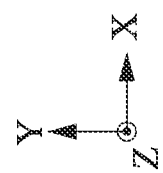
FIGS. 16A and 16B illustrates various cross-sectional views of a portion of the example three-dimensional memory device shown in FIGS. 3A to 13B, in accordance with some other embodiments.
Figure 16A:
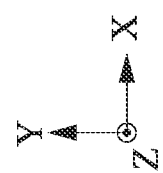

FIGS. 16A and 16B illustrate various other embodiments of the memory device 300, respectively, in the cross-section cut along the X-Y plane and across the dielectric structures 1102 and 1104 (similar as FIG. 14C). As shown in FIGS. 16A-B, sidewalls of the semiconductor film 902 that face toward or away from the Y direction may be offset from sidewalls of the BL1302/SL1304 that face toward or away from the same direction. For example in FIG. 16A, the sidewalls of the semiconductor film 902 are outwardly shifted beyond the sidewalls of the BL 1302 and SL 1304, respectively; and in FIG. 16B, the sidewalls of the semiconductor film 902 are inwardly shifted beyond the sidewalls of the BL 1302 and SL 1304, respectively.

In one aspect of the present disclosure, a memory device is disclosed. The memory device includes a first memory cell. The first memory cell includes: a first conductor structure extending along a lateral direction; a first memory film comprising a first portion wrapping around a first portion of the first conductor structure; and a first semiconductor film wrapping around the first portion of the first memory film. A second conductor structure extends along a vertical direction and is coupled to a first end portion of the first semiconductor film along the lateral direction. A third conductor structure extends along the vertical direction and is coupled to a second end portion of the first semiconductor film along the lateral direction.

In another aspect of the present disclosure, a memory device is disclosed. The memory device includes a memory array comprising a plurality of memory strings laterally disposed apart from each other. A first one of the memory strings includes: a first conductor structure extending along a vertical direction; a second conductor structure extending along the vertical direction; a plurality of third conductor structures each extending along a first lateral direction; and a plurality of first semiconductor films each wrapping around a corresponding one of the plurality of third conductor structures.

In yet another aspect of the present disclosure, a method for fabricating a memory device is disclosed. The method includes forming a first dielectric structure and second dielectric structure each extending along a lateral direction, wherein the first and second dielectric structures are separated apart from each other along a vertical direction. The method includes forming a third dielectric structure extending along the vertical direction and in contact with the first and second dielectric structures. The method includes forming a semiconductor layer extending along the lateral direction and in contact with at least a bottom surface of the first dielectric structure, a top surface of the second dielectric structure, and a sidewall of the third dielectric structure. The method includes forming a first conductor structure extending along the lateral direction, wherein the first conductor structure is wrapped by the semiconductor layer. The method includes replacing end portions of the third dielectric structure along the lateral direction with a second conductor structure and third conductor structure, respectively.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a first memory cell comprising:
        a first conductor structure extending along a first lateral direction;
        a first memory film comprising a first portion wrapping around a first portion of the first conductor structure; and
        a first semiconductor film wrapping around the first portion of the first memory film;
    wherein a second conductor structure extends along a vertical direction and is coupled to a first end portion of the first semiconductor film along the first lateral direction; and a third conductor structure extends along the vertical direction and is coupled to a second end portion of the first semiconductor film along the first lateral direction,
    wherein the first memory film comprises a second portion that is in contact with a top surface and a bottom surface of a second portion of the first conductor structure, and
    wherein the second portion of the first conductor structure and the second portion of the first memory film each extend beyond a sidewall of the first semiconductor film that faces toward or away from the first lateral direction.

2. The memory device of claim 1, further comprising a second memory cell disposed below or above the first memory cell, wherein the second memory cell comprising:
    a fourth conductor structure extending along the first lateral direction and disposed below or above the first conductor structure;
    a second memory film comprising a first portion wrapping around a first portion of the fourth conductor structure; and a second semiconductor film wrapping around the first portion of the second memory film;
wherein the second conductor structure is coupled to a first end portion of the second semiconductor film along the first lateral direction; and the third conductor structure is coupled to a second end portion of the second semiconductor film along the first lateral direction.

3. The memory device of claim 1, further comprising a third memory cell disposed laterally adjacent the first memory cell, wherein the third memory cell comprising:
a fifth conductor structure extending along the first lateral direction and disposed laterally adjacent the first conductor structure;
a third memory film comprising a first portion wrapping around a first portion of the fifth conductor structure; and
a third semiconductor film wrapping around the first portion of the third memory film;
wherein the second conductor structure is coupled to a first end portion of the third semiconductor film along the first lateral direction; and the third conductor structure is coupled to a second end portion of the third semiconductor film along the first lateral direction.

4. The memory device of claim 3, wherein at least one of the first conductor structure, fourth conductor structure, or fifth conductor structure has a void.

5. The memory device of claim 1, wherein the second and third conductor structures each have a sidewall facing toward or away from the first lateral direction, and wherein at least one of the sidewalls is aligned with a sidewall of the first semiconductor film facing toward or away from the first lateral direction.

6. The memory device of claim 1, wherein the second and third conductor structures each have a sidewall facing toward or away from the first lateral direction, and wherein at least one of the sidewalls is offset from a sidewall of the first semiconductor film facing toward or away from the first lateral direction.

7. The memory device of claim 1, further comprising a fourth memory cell disposed laterally adjacent the first memory cell, wherein the fourth memory cell comprising:
a fourth semiconductor film wrapping around a third portion of the first memory film, wherein the third portion of the first memory film wraps around a third portion of the first conductor structure;
wherein a sixth conductor structure extends along the vertical direction and is coupled to a first end portion of the fourth semiconductor film along the first lateral direction; and a seventh conductor structure extend along the vertical direction and is coupled to a second end portion of the fourth semiconductor film along the first lateral direction.

8. The memory device of claim 7, wherein the second and third conductor structures form a first bit line and a first source line for a first memory string, respectively, and the sixth and seventh conductor structures form a second bit line and a second source line for a second memory string, respectively.

9. A memory device, comprising:
a memory array comprising a plurality of memory strings laterally disposed apart from each other, a first one of the memory strings comprising:
a first conductor structure extending along a vertical direction;
a second conductor structure extending along the vertical direction;
a plurality of third conductor structures each extending along a first lateral direction, wherein at least one of the plurality of third conductor structures has a void; and
a plurality of first semiconductor films each wrapping around a corresponding one of the plurality of third conductor structures,
wherein the first memory string further comprises a plurality of first memory films, each of the plurality of first memory films having a portion interposed between each of the first semiconductor films and the corresponding third conductor structure,
wherein a first memory film of the plurality of first memory films comprises a second portion that is in contact with a top surface and a bottom surface of a second portion of the first conductor structure, and
wherein the second portion of the first conductor structure and the second portion of the first memory film each extend beyond a sidewall of the first semiconductor film that faces toward or away from the first lateral direction.

10. The memory device of claim 9, wherein the plurality of third conductor structures are separated from one another along the vertical direction, and wherein the plurality of semiconductor films are separated from one another along the vertical direction.

11. The memory device of claim 9, wherein the first and second conductor structures are each in direct contact with each of the plurality of first semiconductor films.

12. The memory device of claim 9, wherein a second one of the memory strings disposed next to the first memory string along the first lateral direction and comprising:
a fourth conductor structure extending along the vertical direction;
a fifth conductor structure extending along the vertical direction; and
a plurality of second semiconductor films each wrapping around a corresponding one of the plurality of third conductor structures.

13. The memory device of claim 12, wherein the fourth and fifth conductor structures are each in direct contact with each of the plurality of second semiconductor films.

14. The memory device of claim 9, wherein a third one of the memory strings disposed next to the first memory string along a second lateral direction and comprising:
a plurality of sixth conductor structures each extending along the first lateral direction; and
a plurality of third semiconductor films each wrapping around a corresponding one of the plurality of sixth conductor structures.

15. The memory device of claim 14, wherein the first and second conductor structures are each in direct contact with each of the plurality of third semiconductor films.

16. A memory device, comprising:
a first memory cell comprising:
a first conductor structure extending along a first lateral direction, wherein the first conductor structure has a void therewithin;
a first memory film comprising a first portion wrapping around a first portion of the first conductor structure; and
a first semiconductor film wrapping around the first portion of the first memory film,
wherein the first memory film comprises a second portion that is in contact with a top surface and a bottom surface of a second portion of the first conductor structure, and wherein the second portion of the first conductor structure and the second portion of the first memory film each extend beyond a sidewall of the first semiconductor film that faces toward or away from the first lateral direction.

17. The memory device of claim 16, further comprising a second conductor structure extending along a vertical direction and coupled to a first end portion of the first semiconductor film along the first lateral direction.

18. The memory device of claim 17, further comprising a third conductor structure extending along the vertical direction and coupled to a second end portion of the first semiconductor film along the first lateral direction.

19. The memory device of claim 18, wherein the second and the third conductor structures each have a sidewall facing toward or away from the first lateral direction, and wherein at least one of the sidewalls is aligned with a sidewall of the first semiconductor film facing toward or away from the first lateral direction.

20. The memory device of claim 16, wherein the third conductor structure has a void.

* * * * *